(12) United States Patent
Kanehara et al.

(10) Patent No.: US 10,542,230 B2
(45) Date of Patent: Jan. 21, 2020

(54) IMAGING DEVICE

(71) Applicant: PANASONIC INTELLECTUAL PROPERTY MANAGEMENT CO., LTD., Osaka (JP)

(72) Inventors: Hidenari Kanehara, Kyoto (JP); Yasuo Miyake, Osaka (JP); Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/203,166

(22) Filed: Nov. 28, 2018

(65) Prior Publication Data

US 2019/0098244 A1    Mar. 28, 2019

Related U.S. Application Data

(63) Continuation of application No. 15/458,933, filed on Mar. 14, 2017, now Pat. No. 10,178,335.

(30) Foreign Application Priority Data

Mar. 30, 2016 (JP) ................. 2016-067924

(51) Int. Cl.
*H04N 3/14* (2006.01)
*H04N 5/335* (2011.01)
(Continued)

(52) U.S. Cl.
CPC ..... *H04N 5/3745* (2013.01); *H01L 27/14603* (2013.01); *H04N 5/376* (2013.01);
(Continued)

(58) Field of Classification Search
CPC ........... H04N 5/35563; H04N 5/3696; H04N 5/37452; H04N 5/376; H04N 5/2355;
(Continued)

(56) References Cited

U.S. PATENT DOCUMENTS 8,411,185 B2    4/2013 Totsuka
10,178,335 B2 *  1/2019 Kanehara ............ H04N 5/3741
(Continued)

FOREIGN PATENT DOCUMENTS

JP    2002-344809 A    11/2002
JP    2011-119911 A    6/2011
(Continued)

OTHER PUBLICATIONS

Notice of Allowance issued in U.S. Appl. No. 15/458,933, dated Aug. 31, 2018.

(Continued)

*Primary Examiner* — Kelly L Jerabek
(74) *Attorney, Agent, or Firm* — McDermott Will & Emery LLP

(57) ABSTRACT

An imaging device having pixels in a row which include: first pixel including a first photoelectric converter and a first transistor having a first control terminal; second pixel including a second photoelectric converter and a second transistor having a second control terminal; third pixel including a third photoelectric converter and a third transistor having a third control terminal; and fourth pixel including a fourth photoelectric converter and a fourth transistor having a fourth control terminal. The device further including input signal line, a signal for controlling the first to fourth transistors input to the signal line; first buffer circuit having a first input terminal coupled to the signal line, and a first output terminal coupled to the first and second control terminals; and second buffer circuit having a second input terminal coupled to the signal line and a second output terminal coupled to the second and third control terminals.

10 Claims, 15 Drawing Sheets

(51) Int. Cl.
*H04N 5/3745* (2011.01)
*H01L 27/146* (2006.01)
*H04N 5/378* (2011.01)
*H04N 5/374* (2011.01)
*H04N 5/376* (2011.01)

(52) U.S. Cl.
CPC .......... *H04N 5/378* (2013.01); *H04N 5/3741* (2013.01); *H01L 27/14634* (2013.01)

(58) Field of Classification Search
CPC .... H04N 5/355; H04N 5/35536; H04N 5/335; H04N 5/369; H04N 5/3355; H04N 5/341
See application file for complete search history.

(56) References Cited

U.S. PATENT DOCUMENTS

| | | |
|---|---|---|
| 2002/0190215 A1 | 12/2002 | Tashiro et al. |
| 2003/0076431 A1 | 4/2003 | Krymski |
| 2008/0186388 A1 | 8/2008 | Yamagata et al. |
| 2008/0198252 A1 | 8/2008 | Kashiwagi |
| 2011/0128424 A1 | 6/2011 | Yamashita |
| 2012/0044398 A1 | 2/2012 | Chou et al. |
| 2014/0168491 A1 | 6/2014 | Totsuka |
| 2014/0375851 A1 | 12/2014 | Lee et al. |
| 2016/0211299 A1 | 7/2016 | Arita |

FOREIGN PATENT DOCUMENTS

| | | |
|---|---|---|
| JP | 2014-120858 A | 6/2014 |
| JP | 2015-070591 A | 4/2015 |

OTHER PUBLICATIONS

Yasutomi, K. et al. "A Submillimeter Range Resolution Time-of-Flight Range Imager With Column-Wise Skew Calibration," IEEE Transactions on Electron Devices; vol. 63, No. 1; Jan. 2016; pp. 182-188.

* cited by examiner

IMAGING DEVICE

CROSS-REFERENCE OF RELATED APPLICATIONS

This application is a Continuation application of U.S. patent application Ser. No. 15/458,933, filed on Mar. 14, 2017, which in turn claims the benefit of Japanese Application No. 2016-067924, filed on Mar. 30, 2016, the entire disclosures of which Applications are incorporated by reference herein.

BACKGROUND

1. Technical Field

The present disclosure relates to an imaging device.

2. Description of the Related Art

There is a conventionally known technique which measures a distance based on a time between when light is projected to an object and when the light reflected on the object returns. Typically, the time until light reflected on an object returns is calculated based on the difference in phase between light projected onto the object and the detected reflected light, and the calculated time is converted to the distance. Such a distance measuring method is called a time-of-flight (TOF) method.

In recent years, a technique has attracted attention, which applies the TOF method to each of a plurality of pixel cells constituting an image sensor to acquire information concerning the depth of an object on a pixel cell basis. Each pixel cell is caused to function as a distance measuring sensor, and a distance image is constructed based on the output from each pixel cell.

To construct a distance image based on the output from each pixel cell, it is necessary to simultaneously start and end exposure of photoelectric conversion elements (typically, photodiodes) in the respective pixel cells. In other words, the signal charges generated by the individual photoelectric conversion elements of the plurality of pixel cells need to be accumulated for the same period.

The signal charges of a plurality of pixel cells can be accumulated for the same period by causing the image sensor to perform so-called global shutter operation. Japanese Unexamined Patent Application Publication No. 2014-120858 discloses a pixel 100 which the global shutter is applicable to. In the pixel 100, a transfer transistor 11 is connected between a reading node 12, which is connected to a reset transistor 14, and a photoelectric conversion element 10. In the pixel 100, when the reset transistor 14 is turned on, the potential of the reading node 12 is reset to a power supply potential VDD. The timing to start exposure may therefore be determined by the timing to switch the reset transistor 14 off. Moreover, the charges generated in the photoelectric conversion element 10 can be transferred to the reading node 12 at a desired timing by controlling the timing to turn on the transfer transistor 11. The timing to end the exposure can be controlled with a signal applied to the gate of the transfer transistor 11. The global shutter operation can therefore be implemented by simultaneously turning on the transfer transistors 11 of all the pixels 100 forming an imaging region.

SUMMARY

In the above-described imaging device, it is required to minimize the differences in time when the transistors are turned on and off in the plurality of pixel cells.

One non-limiting and exemplary embodiment provides the followings.

In one general aspect, the techniques disclosed here feature an imaging device, including: pixels arranged in rows and columns, the pixels including: a first pixel located in a row, the first pixel including a first photoelectric converter and a first transistor coupled to the first photoelectric converter, the first transistor having a first control terminal; a second pixel located in the row, the second pixel including a second photoelectric converter and a second transistor coupled to the second photoelectric converter, the second transistor having a second control terminal; a third pixel located in the row, the third pixel including a third photoelectric converter and a third transistor coupled to the third photoelectric converter, the third transistor having a third control terminal; and a fourth pixel located in the row, the fourth pixel including a fourth photoelectric converter and a fourth transistor coupled to the fourth photoelectric converter, the fourth transistor having a fourth control terminal. The imaging device further including an input signal line extending along the row, a signal for controlling the first to fourth transistors being input to the input signal line; a first buffer circuit having a first input terminal and a first output terminal, the first input terminal being coupled to the input signal line, the first output terminal being coupled to the first control terminal and third control terminal; and a second buffer circuit having a second input terminal and a second output terminal, the second input terminal being coupled to the input signal line, the second output terminal being coupled to the second control terminal and third control terminal.

It should be noted that general or specific embodiments may be implemented as a element, a device, a system, an integrated circuit, or a method. It should be noted that general or specific embodiments may be also implemented as a element, a device, a system, an integrated circuit, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

In the aforementioned imaging sensor, when the imaging region of the imaging sensor includes a lot of pixel cells, the signal lines are increased in length, and the parasitic capacitance of the long signal lines creates signal delays. In the circuit configuration where the transfer transistors 11 of a plurality of pixels 100 are driven with a single signal line, for example, the larger the number of pixels 100 connected to a signal line, the more difficult to equalize the exposure time of the pixels 100 connected to the signal line.

Figure 2:
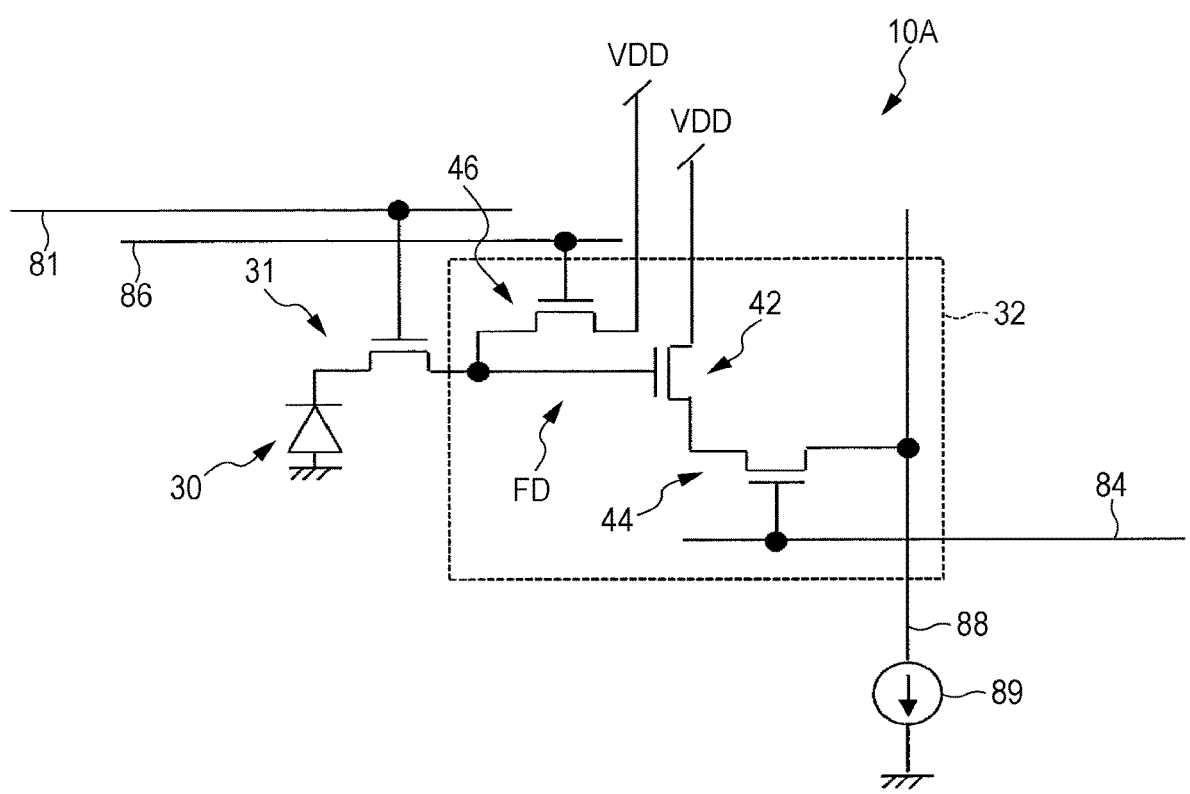
FIG. 2 is a diagram illustrating an exemplary circuit configuration of a pixel cell.

In Japanese Unexamined Patent Application Publication No. 2014-120858 described above, buffers 30 are provided in the middle of a signal line (see FIG. 2, for example). The buffers 30 are connected to the middle of the signal lines at intervals of 3000 pixels, for example. To be more specific, a certain one of the buffers 30 is supplied as an input signal, with an output signal from another buffer 30 which shares the signal line with the buffer 30 of interest. The buffers 30 are thus connected to the signal lines in order to ensure necessary driving performance. According to such a configuration, the influence of attenuation of signals can be reduced, but signal delays still have influence. Moreover, variations in the characteristics of the buffers 30 could increase the differences in time when the transfer transistors 11 are turned on and off in a plurality of pixels 100.

According to an embodiment of the disclosure, an imaging device is provided in which the transistors of the plurality of pixel cells are turned on and off with smaller time differences.

The summary of an aspect of the disclosure is as follows.

[Item 1]

An imaging device, including:

a first pixel cell including a first photoelectric converter and a first transistor electrically connected to the first photoelectric converter, the first transistor having a first control terminal;

a second pixel cell including a second photoelectric converter and a second transistor electrically connected to the second photoelectric converter, the second transistor having a second control terminal;

a first buffer circuit having a first input terminal and a first output terminal, the first buffer circuit receiving a signal for controlling the first transistor through the first input terminal;

a second buffer circuit having a second input terminal and a second output terminal, the second buffer circuit receiving a signal for controlling the second transistor through the second input terminal;

a first control signal line connecting the first output terminal to the first control terminal; and a second control signal line connecting the second output terminal to the second control terminal, wherein the first control signal line and the second control signal line are connected to each other.

[Item 2]

The imaging device according to item 1, further including:

a third pixel cell having a third photoelectric converter and a third transistor electrically connected to the third photoelectric converter, the third transistor having a third control terminal, wherein the first control signal line is connected to the third control terminal.

[Item 3]

The imaging device according to item 2, further including:

a fourth pixel cell having a fourth photoelectric converter and a fourth transistor electrically connected to the fourth photoelectric converter, the fourth transistor having a fourth control terminal, wherein the second control signal line is connected to the fourth control terminal.

[Item 4]

The imaging device according to any one of items 1 to 3, further including:

a first input signal line connected to the first input terminal and the second input terminal.

[Item 5]

The imaging device according to item 4, further including:

a first peripheral driver, wherein one end of the first input signal line is connected to the first peripheral driver.

[Item 6]

The imaging device according to item 5, further including:

a second peripheral driver, wherein the other end of the first input signal line is connected to the second peripheral driver.

[Item 7]

The imaging device according to any one of items 1 to 3, further including:

a first input signal line connected to the first input terminal; and a second input signal line connected to the second input terminal.

[Item 8]

The imaging device according to item 7, wherein the first input signal line and the second input signal line are connected to each other.

[Item 9]

The imaging device according to item 7, further including:

a first peripheral driver, wherein one end of the first input signal line and one end of the second input signal line are connected to the first peripheral driver.

[Item 10]

The imaging device according to item 9, further including:

a second peripheral driver, wherein the other end of the first input signal line and the other end of the second input signal line are connected to the second peripheral driver.

[Item 11]

The imaging device according to any one of items 1 to 10, wherein one of a source and a drain of the first transistor is connected to the first photoelectric converter, and one of a source and a drain of the second transistor is connected to the second photoelectric converter.

[Item 12]

The imaging device according to any one of items 1 to 10, wherein the first pixel cell includes a first transfer transistor, one of a source and a drain of the first transfer transistor being connected to the first photoelectric converter, one of a source and a drain of the first transistor is connected to the other of the source and the drain of the first transfer transistor, the second pixel cell includes a second transfer transistor, one of a source and a drain of the second transfer transistor being connected to the second photoelectric converter, and one of a source and a drain of the second transistor is connected to the other of the source and the drain of the second transfer transistor.

[Item 13]

The imaging device according to item 1, wherein the first buffer circuit and the second buffer circuit each include one or more stages, and a number of the one or more stages of the first buffer circuit is different from a number of the one or more stages of the second buffer circuit.

[Item 14]

The imaging device according to item 13, further including:

a first input signal line connected to the first input terminal and the second input terminal; and a first peripheral driver connected to one end of the first input signal line, wherein a distance between the one end of the first input signal line to the first input terminal is smaller than a distance between the one end of the first input signal line to the second input terminal, and the number of the one or more stages of the first buffer circuit is larger than the number of the one or more stages of the second buffer circuit.

[Item 15]

The imaging device according to any one of items 1 to 14, including a first chip and a second chip different from the first chip, wherein the first buffer circuit and the second buffer circuit are included in the first chip, and the first pixel cell and the second pixel cell are included in the second chip.

[Item 16]

The imaging device according to item 15, wherein the first chip is stacked on the second chip.

[Item 17]

The imaging device according to any one of items 1 to 14, including a first chip having a first surface and a second surface opposite to the first surface, wherein the first buffer circuit and the second buffer circuit are located on the first surface, and the first pixel cell and the second pixel cell are located on the second surface.

[Item 18]

An imaging device, including:

a pixel array including a plurality of pixel cells arranged;

at least one first buffer circuit and at least one second buffer circuit, which are arranged in the pixel array;

a first control signal line connecting to the output of the at least one first buffer circuit; and a second control signal line connecting to the output of the at least one second buffer circuit, wherein the plurality of pixel cells include at least one first pixel cell and at least one second pixel cell, each including a photoelectric converter and a transistor electrically connected to the photoelectric converter, the first control signal line is connected to the input of the transistor of the at least one first pixel cell, the second control signal line is connected to the input of the transistor of the at least one second pixel cell, and the first control signal line and the second control signal line are connected to each other.

According to the configuration of item 18, it is possible to reduce the differences in time when the transistors are turned on and off in the plurality of pixel cells.

[Item 19]

The imaging device according to item 18, wherein the at least one first pixel cell includes a plurality of first pixel cells; and the at least one second pixel cell includes a plurality of second pixel cells.

According to the configuration of item 19, the buffers in the pixel array are shared by the plurality of pixel cells, so that the imaging region is effectively used.

[Item 20]

The imaging device according to item 18 or 19, wherein the number of the at least one first buffer circuit is equal to the number of the at least one first pixel cell, and the number of the at least one second buffer circuit is equal to the number of the at least one second pixel cell.

According to the configuration of item 20, each pixel cell is provided with a buffer, thus preventing variation in the characteristics of the pixel cells.

[Item 21]

An imaging device, including:

a pixel array including a plurality of pixel cells arranged;

at least one first buffer circuit including at least one first buffer connected in series and at least one second buffer circuit including at least one second buffer connected in series, the first buffer circuit and the second buffer circuit being arranged in the pixel array;

a first control signal line connected to the output of any one of the at least one first buffer; and a second control signal line connected to the output of any one of the at least one second buffer, wherein the plurality of pixel cells include at least one first pixel cell and at least one second pixel cell, each including a photoelectric converter and a transistor electrically connected to the photoelectric converter, the first control signal line is connected to the input of the transistor of the at least one first pixel cell, the second control signal line is connected to the input of the transistor of the at least one second pixel cell, and the number of output stage to the first control signal line from an input in the at least one first buffer circuit is different from the number of output stage to the second control signal line from an input in the at least one second buffer circuit.

According to the configuration of item 21, the number of output stage buffer in the buffer circuit is adjusted according to the distance from the peripheral driver, so that the influence of signal delays according to the distance from the peripheral driver can be reduced.

[Item 22]

The imaging device according to item 21, wherein the first control signal line and the second control signal line are connected to each other.

According to the configuration of item 22, it is possible to reduce the differences in time when the transistors are turned on and off in the plurality of pixel cells.

[Item 23]

An imaging device, including:

a first chip including at least one first buffer circuit and at least one second buffer circuit;

a second chip including a pixel array including a plurality of pixel cells arranged and a first control signal line and a second control signal line being connected to an output of the at least one first buffer circuit and an output of the at least one second buffer circuit, respectively, wherein the plurality of pixel cells include at least one first pixel cell and at least one second pixel cell, each including a photoelectric converter and a transistor electrically connected to the photoelectric converter, the first control signal line is connected to the input of the transistor of the at least one first pixel cell, and the second control signal line is connected to the input of the transistor of the at least one second pixel cell.

According to the configuration of item 23, it is possible to reduce the difference in length between the line connecting the first buffer circuit to the first control signal line and the line connecting the second buffer circuit to the second control signal line. This can reduce the differences in time when the transistors are turned on and off in the plurality of pixel cells.

[Item 24]

The imaging device according to item 23, including a stacked structure of the first chip and the second chip.

[Item 25]

The imaging device according to item 23 or 24, wherein the first control signal line and the second control signal line are connected to each other.

According to the configuration of item 25, it is possible to reduce the variation in characteristics of the first buffer circuit and the second buffer circuit and the variation in the parasitic capacitance of the wiring connecting the first buffer circuit to the first control signal line and the wiring connecting the second buffer circuit to the second control signal line.

[Item 26]

The imaging device according to any one of items 23 to 25, further including:

a first wiring line connected to the input of the at least one first buffer circuit, and a second wiring line connected to the input of the at least one second buffer circuit, wherein the first wiring line and the second wiring line are arranged in the first chip.

According to the configuration of item 26, the length of the first wiring line and the length of the second wiring line are easily adjusted. The adjustment of the lengths of the first and second wiring lines can reduce the influence of the difference between signal delays at the inputs of the first buffer circuit and the second buffer circuit.

[Item 27]

The imaging device according to any one of items 18 to 26, further including:

a first peripheral driver and a second peripheral driver which are arranged out of the pixel array;

an input signal line connected to the input of the at least one first buffer circuit and at least one second buffer circuit, wherein the output of the first peripheral driver and the output of the second peripheral driver are connected to each other through the input signal line.

According to the configuration of item 27, it is possible to reduce the influence of signal delays according to the distance from the peripheral drivers.

[Item 28]

The imaging device according to any one of items 18 to 26, further including:

a first peripheral driver and a second peripheral driver which are arranged out of the pixel array;

a first input signal line connected to the input of the at least one first buffer circuit; and a second input signal line connected to the input of the at least one second buffer circuit, wherein each of the first peripheral driver and the second peripheral driver includes a first peripheral buffer and a second peripheral buffer, the output of the first peripheral buffer of the first peripheral driver and the output of the first peripheral buffer of the second peripheral driver are connected to each other through the first input signal line, the output of the second peripheral buffer of the first peripheral driver and the output of the second peripheral buffer of the second peripheral driver are connected to each other through the second input signal line, and the first input signal line and the second input signal line are connected to each other.

According to the configuration of item 28, it is possible to reduce the influence of signal delays according to the distance from the peripheral drivers.

Hereinafter, with reference to the drawings, a description is given of embodiments of the disclosure in detail. The embodiments described below show general or specific examples. The numerical values, shapes, materials, constituent components, arrangements and connections of the constituent components, steps, the sequence of the steps, and the like in the following embodiments are shown by way of example and do not limit the disclosure. The various aspects described in the specification can be combined without inconsistency. Some of the constituent components in the following embodiments which are not described in the independent claim representing the generic concept are described as arbitrary constituent components. In the following description, constituent components including a substantially same function are indicated by a same reference numeral, and the description thereof is sometimes omitted. To prevent some drawings from being excessively complicated, some of the components are not illustrated in the drawings.

First Embodiment

Figure 1:
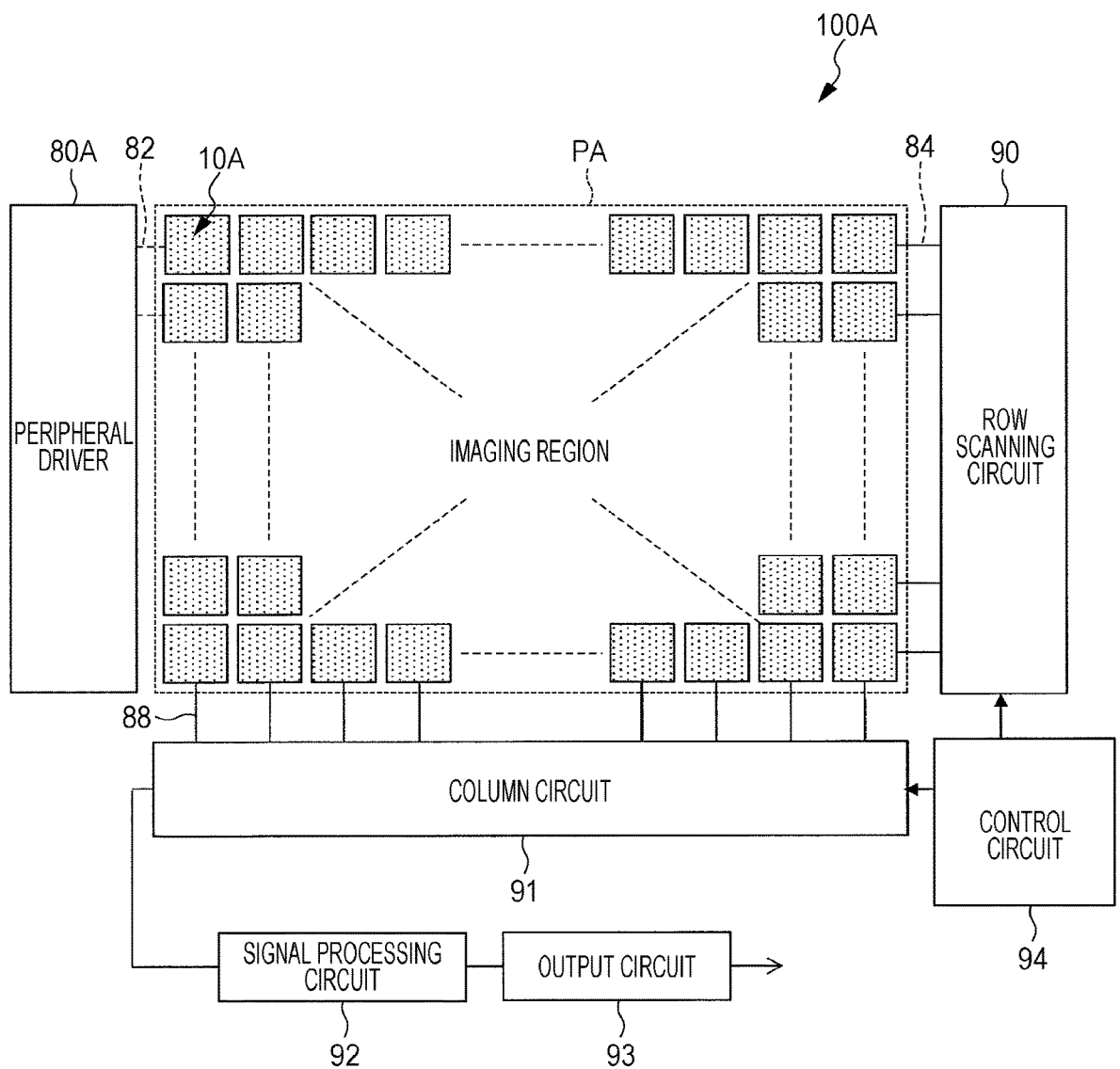
FIG. 1 is a diagram illustrating an exemplary configuration of an imaging device according to a first embodiment of the disclosure.

FIG. 1 illustrates an exemplary configuration of an imaging device according to a first embodiment of the disclosure. An imaging device 100A illustrated in FIG. 1 includes a pixel array PA including a plurality of pixel cells 10A and peripheral circuits. In the first embodiment, a plurality of buffer circuits are arranged in the pixel array PA as described later in detail. FIG. 1 does not illustrate the buffer circuits in the pixel array PA.

Each of the pixel cells 10A includes a photoelectric converter and a reading circuit as described later. The pixel cells 10A are arrayed in a two-dimensional manner in a semiconductor substrate, for example, to form an imaging region. In this example, the pixel cells 10A are arranged in an m-by-n matrix (m and n are integers not less than two). In the illustrated example, the center of each pixel cell 10A is located at a lattice point of a square lattice. The arrangement of the pixel cells 10A is not limited to the illustrated example. The pixel cells 10A may be arranged so that the centers thereof are located at respective lattice points of a triangle or hexagonal lattice. The plurality of pixel cells 10A may be also arranged in a one-dimensional manner.

In the configuration illustrated in FIG. 1, the peripheral circuits include a peripheral driver 80A, a row scanning circuit 90, a column circuit 91, a signal processing circuit 92, an output circuit 93, and a control circuit 94. The peripheral circuits may be arranged on the semiconductor substrate where the pixel array PA is formed or may be partially arranged on another substrate.

The peripheral driver 80A includes connection with a plurality of input signal lines 82. In FIG. 1, the input signal lines 82 are provided corresponding to the respective rows of the plurality of pixel cells 10A. However, this is illustrated by way of example. The number of the input signal lines 82 is not necessarily equal to the number of rows of the pixel cells 10A in the pixel array PA. Each input signal line 82 is connected to inputs of buffer circuits in the pixel array PA as described later.

As schematically illustrated in FIG. 1, the peripheral driver 80A is provided out of the pixel array PA. Herein, the pixel array PA is typically formed as an assembly of pixel cells as a unit structure each including a reading circuit. Accordingly, the range of the pixel array PA is defined by the range where the pixel cells are arranged.

The row scanning circuit 90 includes connection with address control lines 84 provided corresponding to the respective rows of the plurality of pixel cells 10A. Each address control line 84 is connected to the pixel cells 10A in the corresponding row. By applying predetermined voltage to the address control lines 84, the row scanning circuit 90 selects the pixel cells 10A on a row basis and reads signal voltage. The row scanning circuit 90 can be called a vertical scanning circuit. The row scanning circuit 90 may include connection with reset control lines, which are not illustrated in FIG. 1. The reset control lines are provided corresponding to the respective rows of the plurality of pixel cells 10A and are connected to gates of reset transistors of the pixel cells 10A in the corresponding row. In the above-described configuration, the row scanning circuit 90 applies predetermined voltage to the reset control lines to execute reset operation for the pixel cells 10A.

The column circuit 91 includes connections with a plurality of output signal lines 88 provided corresponding to the respective columns of the plurality of pixel cells 10A. The pixel cells 10A in a same column are commonly connected to the corresponding one of the plurality of output signal lines 88. The output signals from the pixel cells 10A selected on a row basis by the row scanning circuit 90 are read by the column circuit 91 through the output signal lines 88. The column circuit 91 performs noise suppression signal processing represented by correlated double sampling, analog-digital conversion (AD conversion), and the like for the output signals read from the pixel cells 10A.

The signal processing circuit 92 performs various types of processing for image signals acquired from the pixel cells 10A. The output of the signal processing circuit 92 is read out of the imaging device 100A through the output circuit 93.

The control circuit 94 receives externally given instruction data, clock, and the like for the imaging device 100A, for example, to control the entire imaging device 100A. The control circuit 94 typically includes a timing generator and supplies driving signals to the row scanning circuit 90, column circuit 91, and the like. The control circuit 94 may be configured to calculate the distance between the imaging surface and an object based on the output from each pixel cell 10A.

FIG. 2 illustrates an exemplary circuit configuration of each pixel cell 10A. In the exemplary configuration illustrated in FIG. 2, the pixel cell 10A includes a photoelectric converter 30, a reading circuit 32, and a transfer transistor 31 connected between the photoelectric converter 30 and the reading circuit 32.

The photoelectric converter 30 is irradiated with incident light to generate signal charges according to the illuminance. The polarity of the signal charges may be either positive or negative. In the following description, the photoelectric converter 30 is a photodiode by way of example. However, the photoelectric converter 30 is not limited to a photodiode and may be a photoelectric conversion layer made of an organic material or an inorganic material such as amorphous silicon, for example. The photoelectric conversion layer is provided on an interlayer insulating layer covering the semiconductor substrate, for example. The imaging device of the disclosure can be therefore a so-called stacked image sensor.

The transfer transistor 31 switches the conditions where the signal charges generated by the photoelectric converter 30 are transferred to the reading circuit 32 and where the signal charges are not transferred. The transfer transistor 31 is typically a field-effect transistor (FET) formed in a semiconductor substrate. In the example described below, the transistors are N-channel MOSFETs unless otherwise noted. The transfer transistor 31 is therefore an N-channel MOSFET by way of example. The semiconductor substrate is not limited to a substrate entirely composed of a semiconductor layer and may be an insulating substrate in which a semiconductor layer is provided on the side where the imaging region is formed.

The gate as the input of the transfer transistor 31 is connected to a control signal line 81. As described later, the control signal line 81 receives output voltages from at least two of the plurality of buffer circuits provided in the pixel array PA. The transfer transistor 31 is on-off controlled depending on the voltage level of the connected control signal line 81. When the transfer transistor 31 is turned on, signal charges generated by the photoelectric converter 30 are transferred to a charge storage node (also referred to as a floating diffusion node) FD between the photoelectric converter 30 and reading circuit 32.

The reading circuit 32 detects the electric signal which is generated by the photoelectric converter 30 and transferred to the charge storage node FD. In the configuration illustrated in FIG. 2, the reading circuit 32 includes a signal detection transistor 42 and an address transistor 44. As illustrated in FIG. 2, the gate of the signal detection transistor 42 is connected to an output (one of the source and the drain) of the transfer transistor 31. The source of the signal detection transistor 42 is connected to the output signal line 88 through the address transistor 44. The gate of the address transistor 44 is connected to the address control line 84. The address transistor 44 is on-off controlled by the row scanning circuit 90 through the address control line 84.

The output signal line 88 includes a constant current supply 89 at a first end. The constant current supply 89 is composed of the above-described column circuit 91 (see FIG. 1) and the like. The drain of the signal detection transistor 42 is connected to a power supply line (a source follower power supply). The signal detection transistor 42 and constant current supply 89 constitute a source follower circuit. While the imaging device 100A is in operation, the signal detection transistor 42 is supplied with the power supply voltage VDD at the drain to amplify and output the voltage applied to the gate, that is, the voltage of the charge storage node FD. The signal amplified by the signal detection transistor 42 is selectively read through the output signal line 88 as a signal voltage.

In this example, the reading circuit 32 includes a reset transistor 46. One of the source and the drain of the reset transistor 46 is connected to a power supply line. The other is connected to the charge storage node FD. The gate of the reset transistor 46 is connected to a reset control line 86. The voltage level of the reset control line 86 can be controlled by the row scanning circuit 90. The reset transistor 46 is can be on-off controlled by the row scanning circuit 90. When the reset transistor 46 and transfer transistor 31 are turned on, the photoelectric converter 30 is reset.

Figure 3:
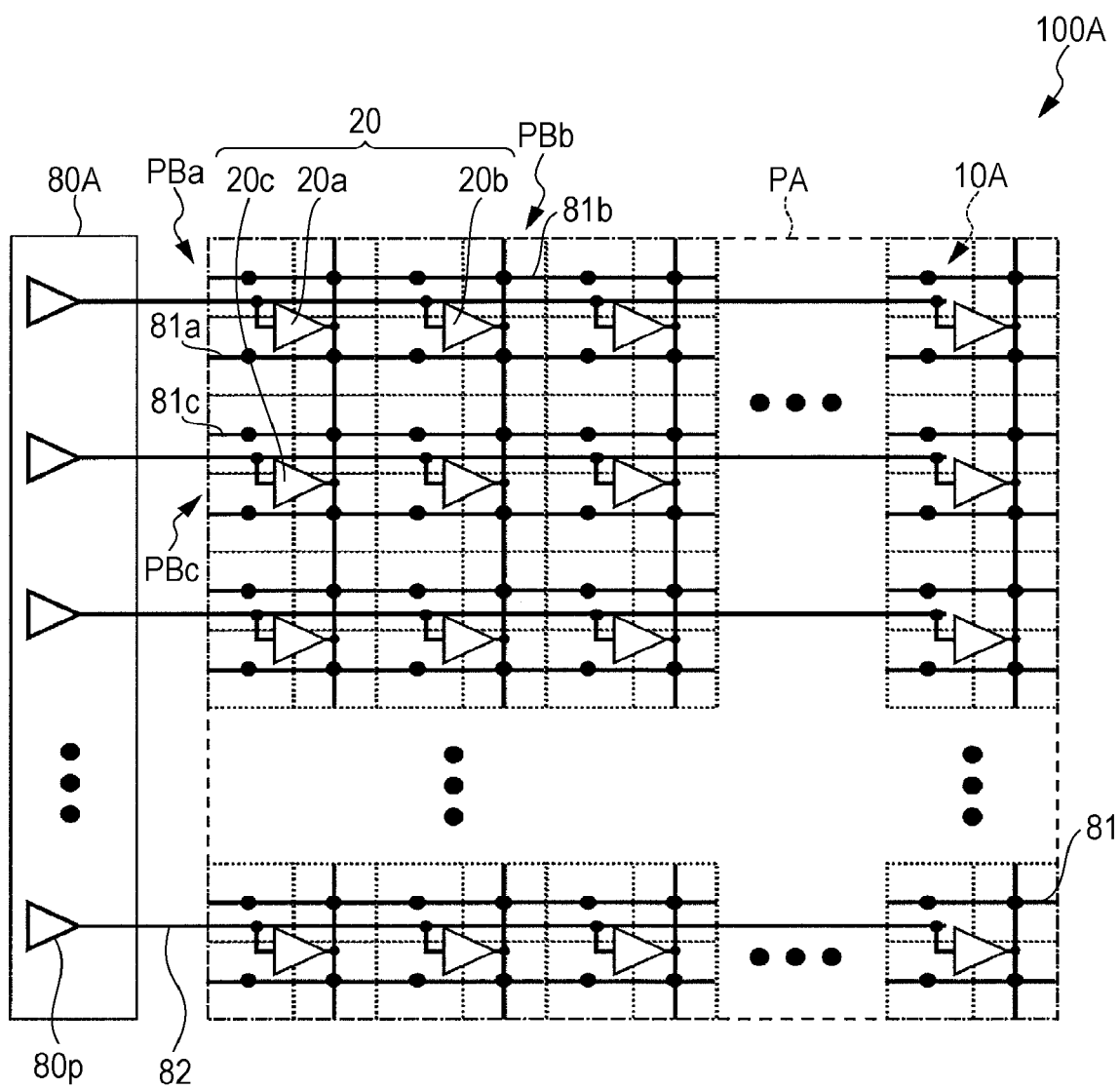
FIG. 3 is a schematic diagram illustrating connection between pixel cells in a pixel array and a peripheral driver.

FIG. 3 schematically illustrates connection between the pixel cells 10A in the pixel array PA and the peripheral driver 80A. As schematically illustrated in FIG. 3, the imaging device 100A includes a plurality of buffer circuits 20 arranged in the pixel array PA. In this example, each buffer circuit 20 is provided for four pixel cells 10A. In this specification, a buffer circuit refers to a circuit including one or more buffers. The individual buffers constituting each buffer circuit are inverters (inverting buffers) using a transistor or an inverting amplifier, for example. As for the specific circuit configuration of each buffer, the buffer is not limited to an inverter and can be composed of an emitter follower, a source follower, a voltage follower using an operational amplifier, or the like.

As illustrated in FIG. 3, the input of each buffer circuit 20 is connected to the input signal line 82 connected to the peripheral driver 80A. The peripheral driver 80A includes peripheral buffers 80p connected to the respective input signal lines 82 and drives the buffer circuits 20 arranged in the pixel array PA, through the input signal lines 82. In this example, the inputs of the plurality of buffer circuits 20 arranged along the direction that the rows of the plurality of pixel cells 10A extend (hereinafter, just referred to as a row direction) are commonly connected to one of the input signal lines 82. For example, the inputs of buffer circuits 20a and 20b, which are located at the top row in FIG. 3 among the plurality of buffer circuits 20 arranged in a matrix within the pixel array PA, are commonly connected to the input signal line 82 located at the top in FIG. 3.

Figure 4:
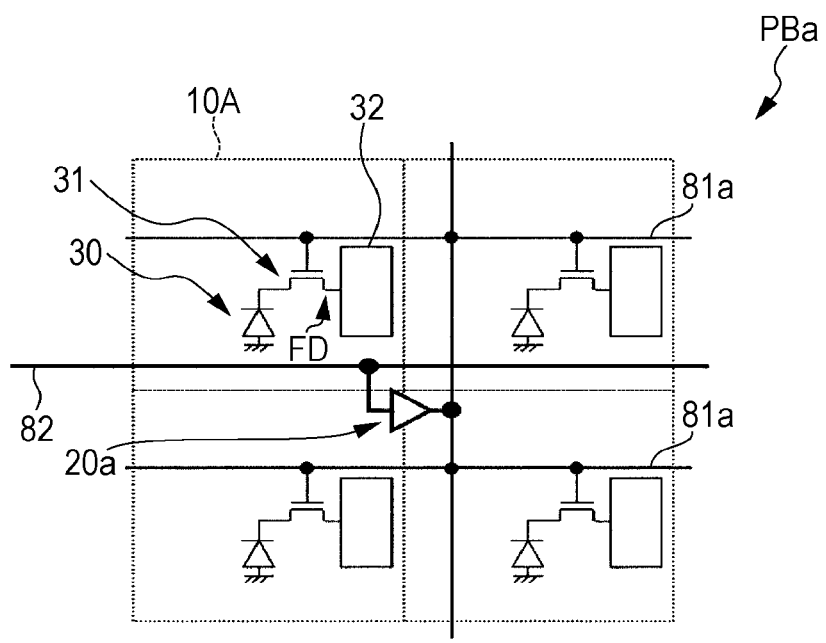
FIG. 4 is an enlarged diagram schematically illustrating a buffer circuit illustrated in FIG. 3 and four pixel cells provided therearound.

FIG. 4 illustrates an enlarged view of the buffer circuit 20a illustrated in FIG. 3 and the periphery thereof. FIG. 4 illustrates a pixel block PBa including the buffer circuit 20a and four pixel cells 10A arranged in two rows and two columns. In the pixel block PBa, as illustrated in FIG. 4, a control signal line 81a, which is connected to the gates of the transfer transistors 31 of the four pixel cells 10A, is provided. In this example, the control signal line 81a forms a grid. The control signal line 81a is connected to the output of the buffer circuit 20a as illustrated in FIG. 4. The transfer transistors 31 of the four pixel cells 10A included in the pixel block PBa are on-off controlled by the output voltage from the buffer circuit 20a. In this example, the gates of the transfer transistors 31 of the four pixel cells 10A placed close to each other are connected to each other through the control signal line 81a. This means that the transfer transistors 31 of these four pixel cells 10A are turned on and off at the same time.

With reference to FIG. 3 again, the circuit configuration of each of the other buffer circuits 20 arranged in the pixel array PA and the peripheral circuits thereof can be the same as those of the pixel block PBa illustrated in FIG. 4. The pixel array PA is therefore a repetitive structure of a plurality of pixel blocks.

For example, in a pixel block PBb, which includes a buffer circuit 20b and four pixel cells 10A therearound, a grid-shaped control signal line 81b is provided. The control signal line 81b includes connection with each of the four pixel cells 10A. The gates of the transfer transistors 31 of the four pixel cells 10A around the buffer circuit 20b are connected to the control signal line 81b. Accordingly, the transfer transistors 31 of the four pixel cells 10A included in the pixel block PBb are on-off controlled by the output voltage from the buffer circuit 20b. In a similar manner, in a pixel block PBc, which is next to the pixel block PBa in the direction along the columns of the plurality of pixel cells 10A, a buffer circuit 20c and a grid-shaped control signal line 81c are provided. The gates of the transfer transistors 31 of the pixel cells 10A included in the pixel block PBc are connected to each other through the control signal line 81c.

As schematically illustrated in FIG. 3, the control signal line 81a in the pixel block PBa and the control signal line 81b in the pixel block PBb are connected to each other. In other words, the output of the buffer circuit 20a of the pixel block PBa and the output of the buffer circuit 20b of the pixel block PBb are connected electrically. As illustrated in FIG. 3, when the outputs from two or more buffer circuits 20 each connected to the gates of one or more transfer transistors 31 are connected to each other, it is possible to reduce the differences in time when the transfer transistors 31 are turned on and off.

In the example illustrated in FIG. 3, the control signal lines for all the pixel blocks constituting the pixel array PA are connected to each other. For example, the control signal line 81a in the pixel block PBa and the control signal line 81c in the pixel block PBc are connected to each other. Accordingly, the control signal lines 81a, 81b, and 81c are connected to each other. In this example, the control signal line 81 forms a grid as a whole and is arranged in the pixel array PA, connecting the outputs of the plurality of buffer circuits 20 in the pixel array PA. The control signal line 81 includes connection with the gates of the transfer transistors 31 of the pixel cells 10A included in the pixel array PA. Accordingly, the control signal can be commonly applied to the transfer transistors 31 of the pixel cells 10A included in the pixel array PA, through the control signal line 81.

The control signal lines connected to the outputs of the buffer circuits 20 in a plurality of pixel blocks are connected to each other, thus canceling the influence of signal delays according to the distance from the peripheral driver 80A and reducing the differences in time when the transfer transistors 31 are turned on and off in the plurality of pixel cells 10A. Moreover, the outputs of two or more buffer circuits 20 are connected to each other, thus averaging variations in characteristics of the buffer circuits 20 and variations in parasitic capacitance of control signal lines in the pixel blocks. This can reduce the differences in time when the plurality of transfer transistors 31 are turned on and off which are produced due to the variations in the transistor characteristics and parasitic capacitance.

The control signal lines of all of the pixel blocks constituting the pixel array PA are connected to each other as illustrated in FIG. 3, so that the transfer transistors 31 of all of the pixel cells 10A in the pixel array PA can be turned on or off simultaneously. Certainly, it is unnecessary to connect the outputs of all the buffer circuits 20 provided in the pixel array PA. For example, in order to simultaneously turn on or off the transistors of some of the pixel cells 10A constituting the pixel array PA, it is necessary to connect the outputs of the buffer circuits 20 which supply control signals to the transistors of the pixel cells 10A of interest.

In the example illustrated in FIGS. 3 and 4, each buffer circuit 20 is provided for four pixel cells 10A. However, the number of pixel cells 10A each buffer circuit 20 is provided for, that is, the number of pixel cells 10A included in each pixel block is not limited to the example explained with reference to FIGS. 3 and 4 and can be set to any value. For example, each buffer circuit 20 may be provided for a pixel block including the pixel cells 10A arranged in a 4-by-4 or 16-by-16 matrix. When each buffer circuit 20 is shared by a plurality of pixel cells 10A, it is possible to minimize the space not contributing to imaging, thus enabling effective use of the imaging region. Certainly, the number of rows of pixel cells 10A in each pixel block does not need to equal to the number of columns.

Each buffer circuit 20 can be located near the center of the corresponding pixel block. Specifically, each pixel block is composed of pixel cells 10A arranged in a 2-by-2 matrix, and each buffer circuit 20 is located at the center of the corresponding pixel block. Accordingly, the light receiving regions of the four pixel cells 10A can be arranged symmetrically. In other words, the light receiving regions of the four pixel cells 10A can be congruent. This can easily ensure the structural symmetry of the pixel cells 10A in each pixel block. Such a configuration is advantageous from the viewpoint of reducing variations in the characteristics of the pixel cells 10A.

Figure 5:
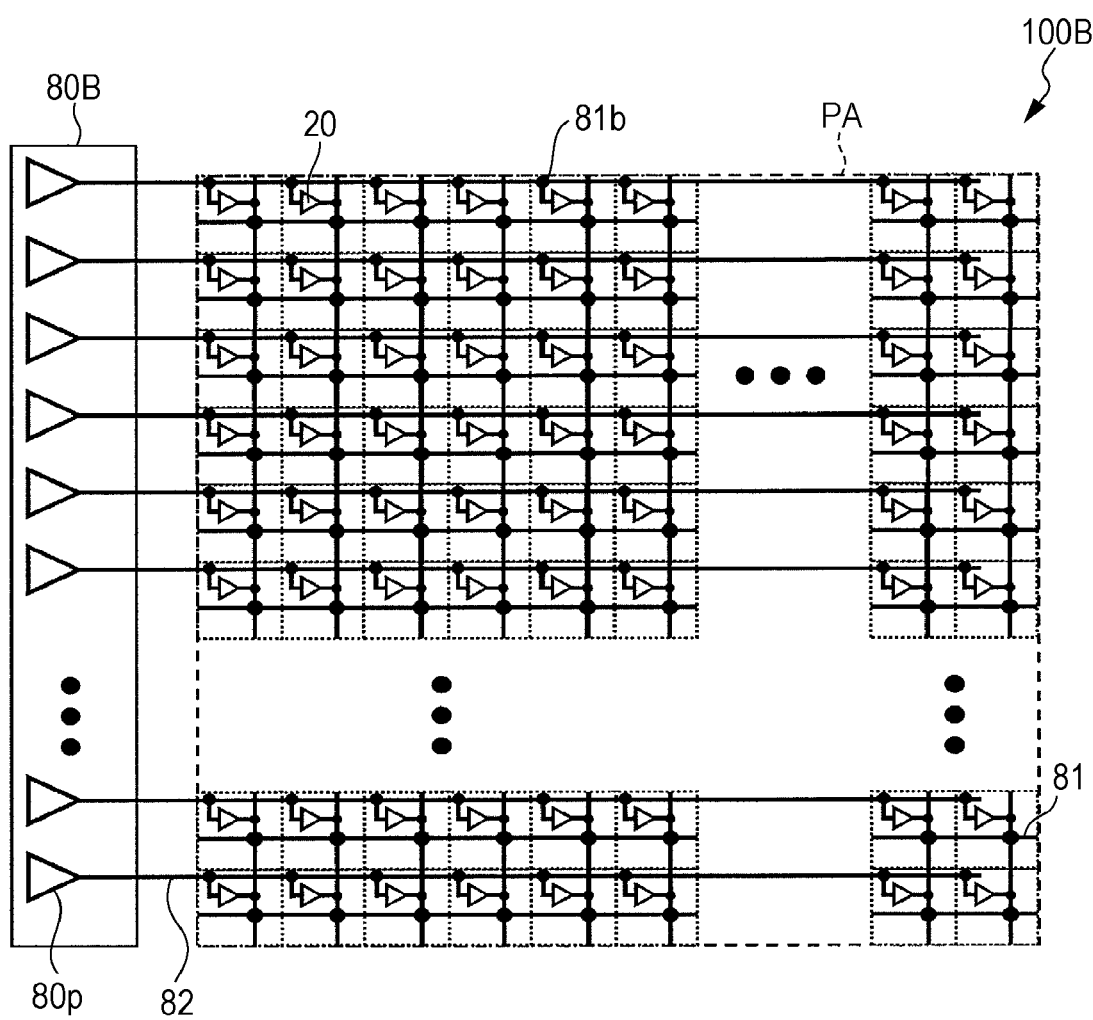
FIG. 5 is a diagram illustrating an example in which each pixel cell is provided with a buffer circuit.
Figure 6:
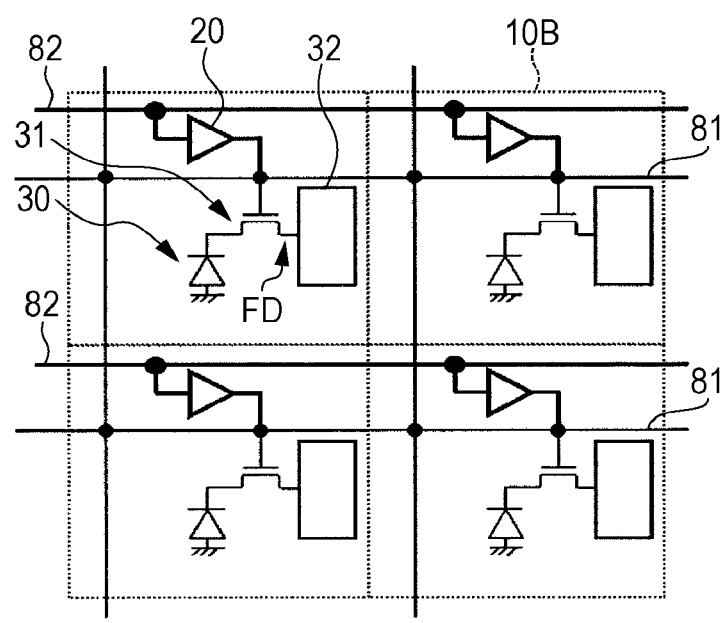
FIG. 6 is a diagram illustrating four pixel cells placed adjacent to each other among the pixel cells illustrated in FIG. 5.

Alternatively, each buffer circuit may be provided for one pixel cell. FIG. 5 illustrates an example in which each buffer circuit is provided for a pixel cell. FIG. 6 illustrates four pixel cells which are placed close to each other among the pixel cells illustrated in FIG. 5.

An imaging device 1008 illustrated in FIG. 5 includes a pixel array PA including a plurality of pixel cells 10B and a peripheral driver 80B. In this example, each pixel cell 10B is provided with one buffer circuit 20. Accordingly, input signal lines 82 including connections with the peripheral driver 80B are provided for the respective rows of the plurality of pixel cells 10B. As schematically illustrated in FIG. 5, the inputs of the plurality of buffer circuits 20 arranged along the row direction of the plurality of pixel cells 10B are commonly connected to one of the input signal lines 82.

As illustrated in FIG. 6, in this example, the output of each buffer circuit 20 is connected to the gate of the transfer transistor 31 of the corresponding pixel cell 10B. In this example, moreover, the gates of the transfer transistors 31 of the pixel cells 10B are connected to each other through the control signal line 81. The configuration illustrated in FIG. 6 is an example in which, in a certain pixel block, the number of pixel cells 10B including the transfer transistors 31 with the gates connected to each other through the control signal line 81 is equal to the number of buffer circuits 20 with the outputs connected to the control signal lines 81.

As described above, each buffer circuit 20 may be provided for one pixel cell 10B. When the number of the pixel cells 10B in the pixel array PA is equal to the number of buffer circuits 20 provided in the pixel array PA, the symmetry of the plurality of pixel cells 10B is ensured, thus reducing the influences of the variation in the transistor characteristics in the pixel array PA, the variation in parasitic capacitance of wirings, and the like. It is therefore possible to reduce the differences in time when the plurality of transfer transistors 31 are turned on and off.

Second Embodiment

Figure 7:
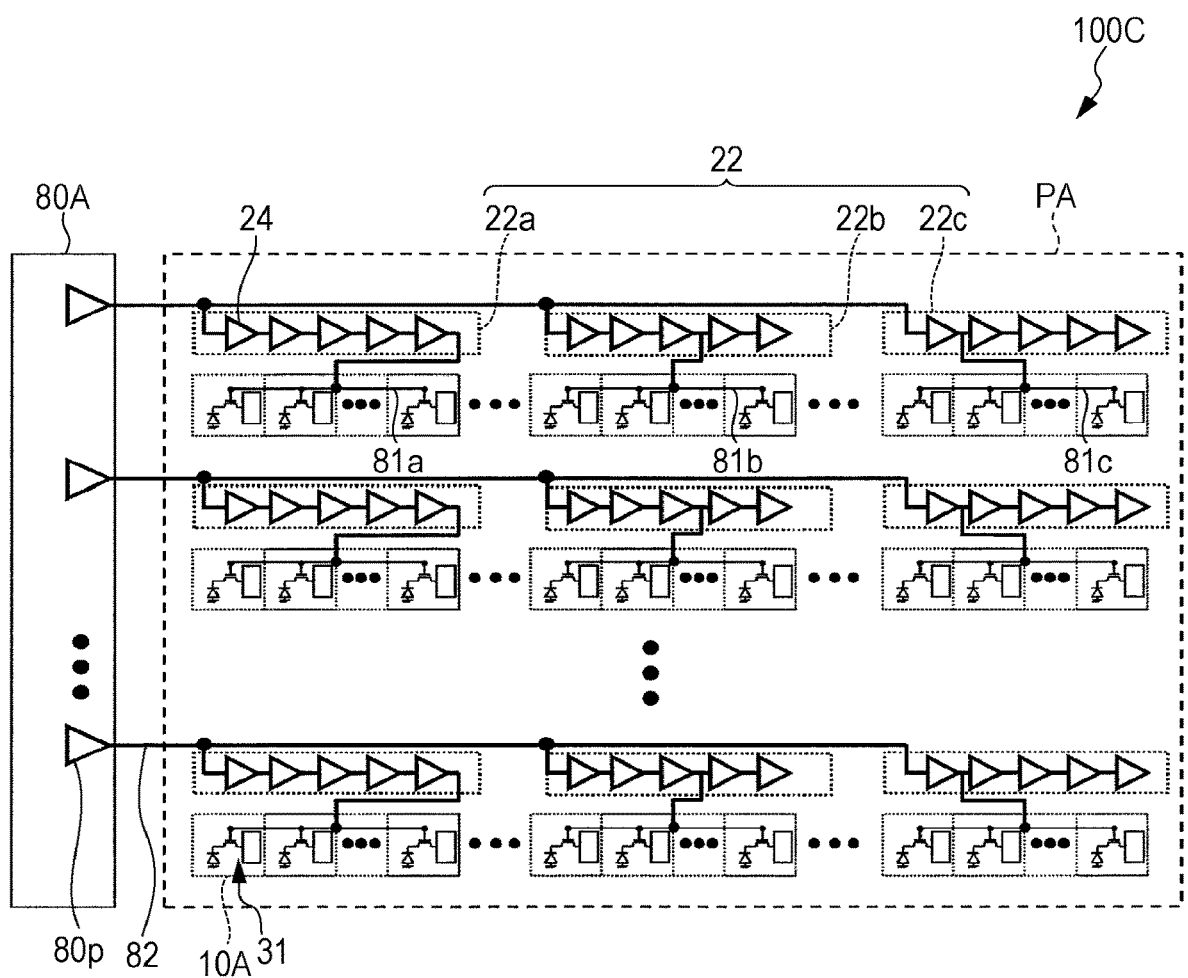
FIG. 7 is a diagram illustrating an exemplary configuration of an imaging device according to a second embodiment of the disclosure.

FIG. 7 illustrates an exemplary configuration of an imaging device according to a second embodiment of the disclosure. An imaging device 100C illustrated in FIG. 7 includes a plurality of buffer circuits 22 arranged in the pixel array PA. In this example, the plurality of buffer circuits 22 include buffer circuits 22a, 22b, and 22c with the inputs connected to a common input signal line 82. The outputs of the buffer circuits 22a, 22b, and 22c are connected to the control signal lines 81a, 81b, and 81c, respectively. As illustrated in FIG. 7, each of the control signal lines 81a, 81b, and 81c includes connection with gates of the transfer transistors 31 of the plurality of pixel cells 10A. In FIG. 7, the plurality of pixel cells 10A connected to the control signal line 81a are arranged in line along the horizontal direction in the page, for example. This is for convenience of explanation, and the plurality of pixel cells 10A connected to the control signal line 81a can be arranged in a matrix, for example. In other words, each of the control signal lines 81a, 81b, and 81c can constitute a grid-shaped wiring.

Each of the plurality of buffer circuits 22 arranged in the pixel array PA includes one or more buffers 24 connected in series. Herein, as illustrated in FIG. 7, the number of buffers 24 connected between the input and output varies between the buffer circuits 22a, 22b, and 22c. For example, in the buffer circuit 22a with the input being closest to the peripheral driver 80A, the control signal line 81a is connected to the output of the fifth one of five buffers included in the buffer circuit 22a. In the buffer circuit 22c with the input being the most distant from the peripheral driver 80A, the control signal line 81c is connected to the output of the first one of five buffers included in the buffer circuit 22c. The buffer circuit 22c located between the buffer circuits 22a and 22c, the control signal line 81b is connected to the output of the third one of five buffers included in the buffer circuit 22b.

In the second embodiment, the number of output stage buffer in the buffer circuit 22 is varied depending on the distance from the peripheral driver 80A to the buffer circuit 22 of interest. By adjusting the number of buffers 24 connected between the input of a buffer circuit 22 and the control signal line connected to the output of the buffer circuit 22 of interest, it is possible to reduce the influence of signal delays according to the distance from the peripheral driver 80A. In the example illustrated in FIG. 7, the number of buffers 24 provided between the input signal line 82 and control signal line is reduced with distance from the peripheral driver 80A. According to such connection, it is possible to reduce the difference in delay between signals supplied from the plurality of buffer circuits 22 with the inputs connected to the same input signal line 82. This can reduce the difference between the time when the transfer transistors 31 with the gates connected to the control signal line 81a are turned on and off and the time when the transfer transistors 31 with the gates connected to the control signal line 81c are turned on and off, for example.

Figure 8:
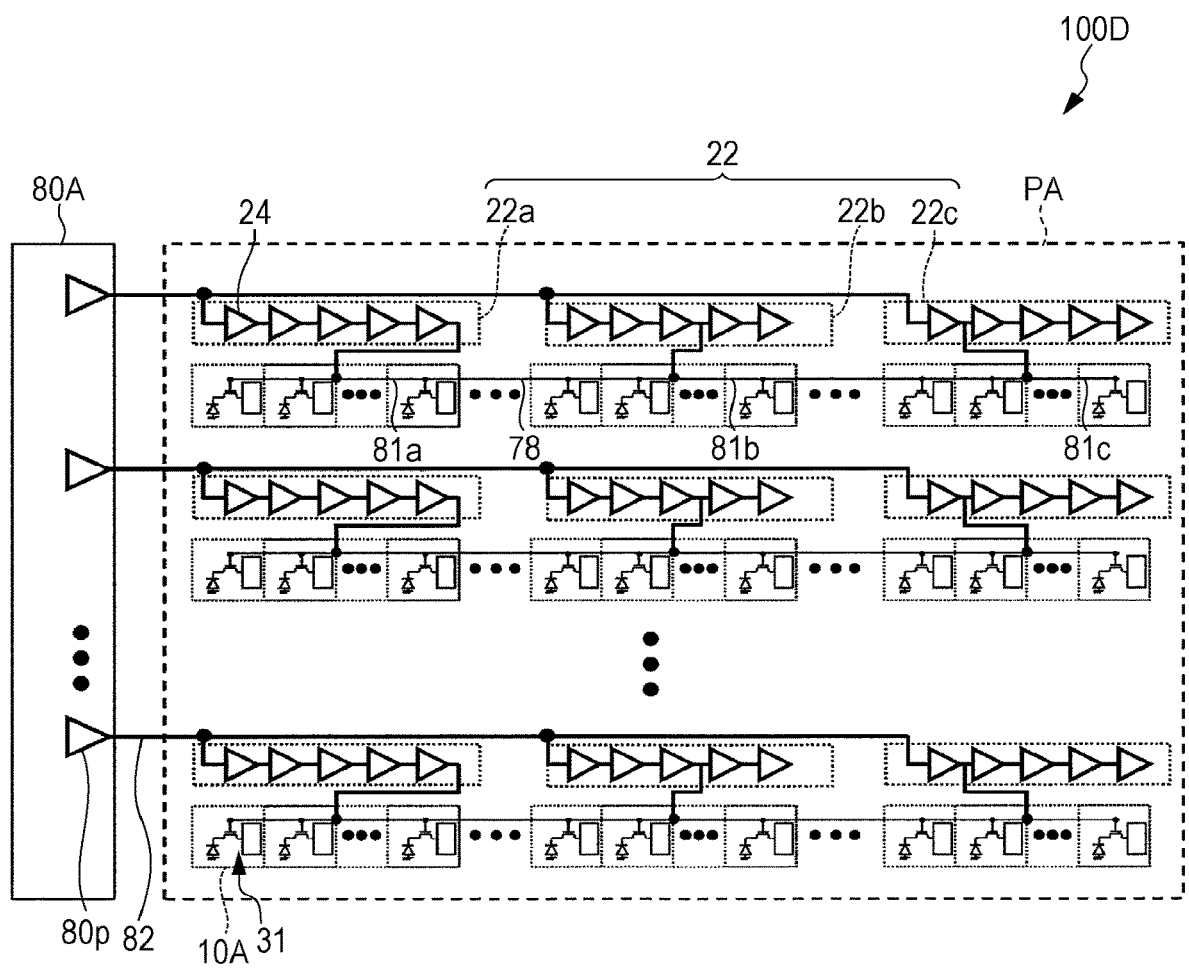
FIG. 8 is a diagram illustrating an imaging device according to a modification of the second embodiment of the disclosure.

FIG. 8 illustrates an imaging device according to a modification of the second embodiment of the disclosure. In an imaging device 100D illustrated in FIG. 8, control signal lines (control signal lines 81a, 81b, and 81c, for example) connected to the outputs of the buffer circuits 22 (buffer circuit 22a, 22b, and 22c, for example) commonly connected to the input signal line 82 are connected to each other through connection lines 78. By connecting the control signal lines in the plurality of pixel blocks arranged in the row direction of the plurality of pixel cell 10A as illustrated in FIG. 8, signal delays in the pixel blocks can be averaged. It is therefore possible to reduce the differences in time when the transistors 31 are turned on and off in the plurality of pixel blocks arranged in the row direction of the plurality of pixel cells 10A as well as in each pixel block.

Figure 9:
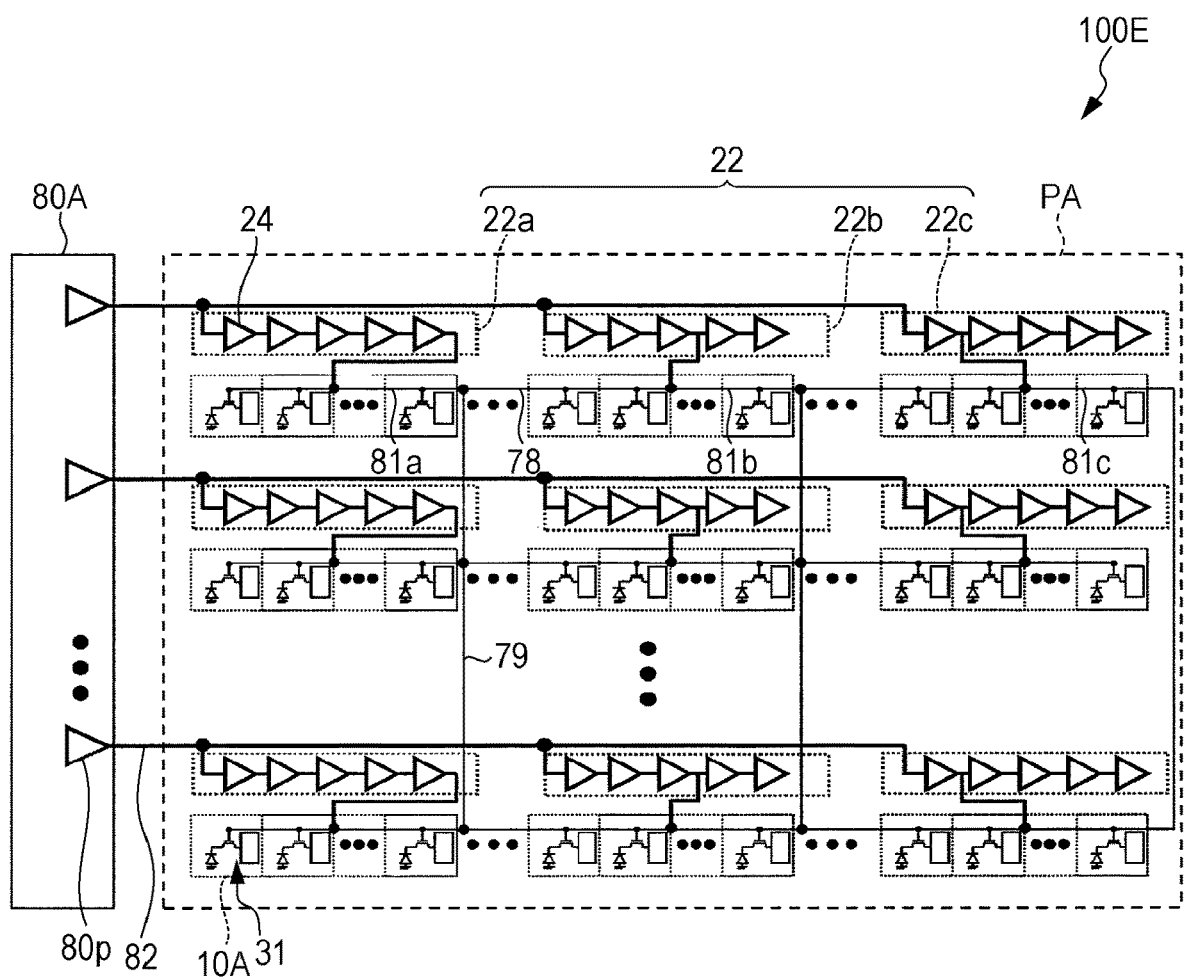
FIG. 9 is a diagram illustrating an imaging device according to another modification of the second embodiment of the disclosure.

FIG. 9 illustrates an imaging device according to another modification of the second embodiment of the disclosure. In an imaging device 100E illustrated in FIG. 9, control signal lines in a plurality of pixel blocks arranged in the direction that the columns of the plurality of pixel cells 10A extend (hereinafter, just referred to as a column direction) are connected to each other through connection lines 79. By connecting control signal lines of a plurality of pixel blocks arranged in the column direction as well as in the row direction as illustrated in FIG. 9, it is possible to average the variation in transistor characteristics and variation in parasitic capacitance of wirings for each row of the pixel cells 10A, for example.

Herein, another example of connection between the peripheral driver and pixel cells in the pixel array is described. In the configurations illustrated in FIGS. 1, 3, 5, and 7 to 9, one peripheral driver is provided along one side of the rectangular pixel array PA. However, this is just illustrated by way of example, and the number of peripheral drivers is not limited to one.

Figure 10:
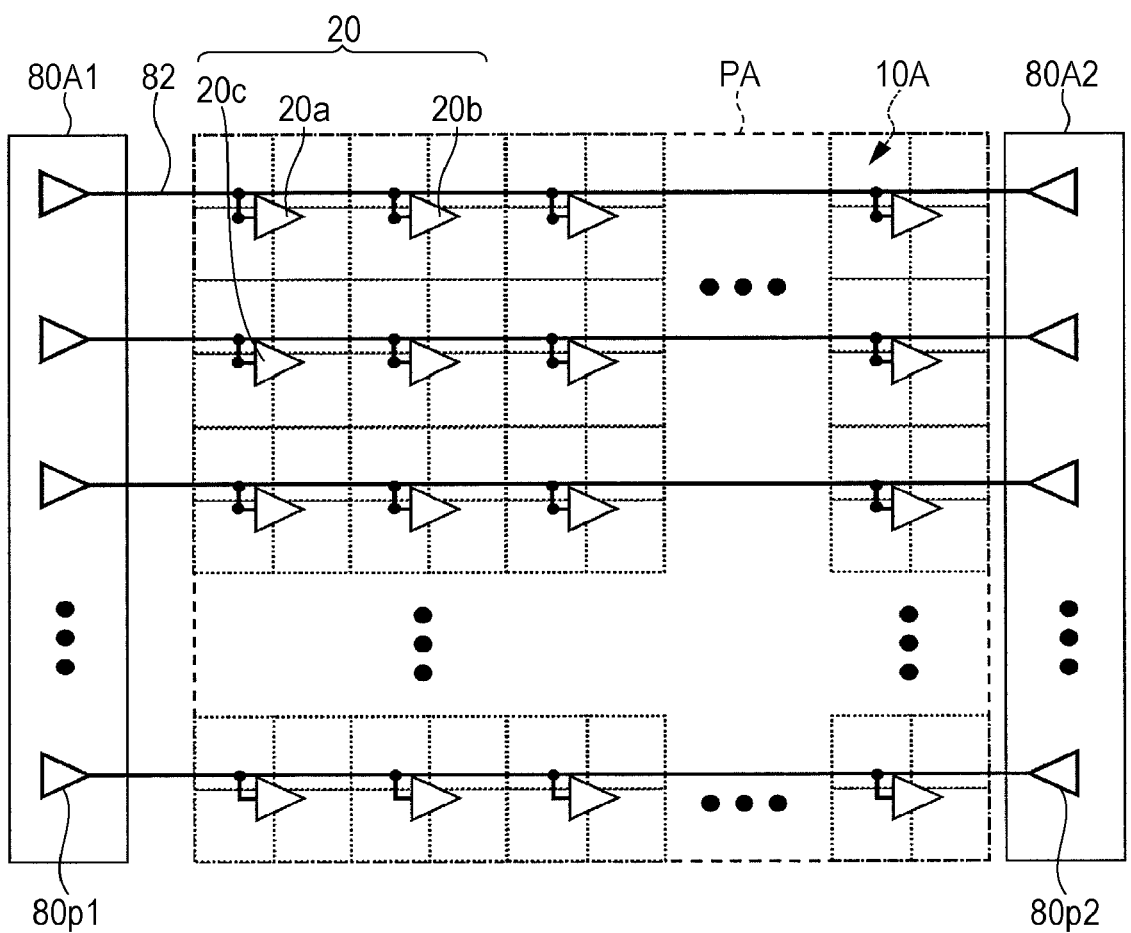
FIG. 10 is a diagram illustrating an example of arrangement of peripheral drivers.

FIG. 10 illustrates another example of arrangement of peripheral drivers. In the configuration illustrated in FIG. 10, the pixel array PA includes the same configuration as that described with reference to FIG. 3, for example. Herein, the control signal line 81 is not illustrated to prevent the drawing from being complicated.

In the example illustrated in FIG. 10, peripheral drivers 80A1 and 80A2 are provided to the left and right of the pixel array PA, respectively. An input signal line 82 which is located at the top in FIG. 10 among a plurality of input signal lines 82 extending in the row direction, for example, connects the output of one of peripheral buffers 80p1 in the peripheral driver 80A1 to the output of one of peripheral buffers 80p2 in the peripheral driver 80A2. The input signal line 82 is connected to the input of a buffer circuits 20a and the input of a buffer circuit 20b. The second input signal line 82 from the top connects the output of another one of the peripheral buffers 80p1 to the output of another one of the peripheral buffers 80p2. The second input signal line 82 is connected to the input of a buffer circuit 20c, which is adjacent to the buffer circuit 20a in the column direction of the plurality of pixel cells 10A.

As illustrated in FIG. 10, in this example, each input signal line 82 is connected to both one of the peripheral buffers 80p1 in the peripheral driver 80A1 and the corresponding one of the peripheral buffers 80p2 in the peripheral driver 80A2. By connecting the outputs of a plurality of peripheral drivers (the peripheral drivers 80A1 and 80A2 herein) to each other through the input signal lines 82 as described above, it is possible to reduce the influence of signal delays according to the distance from the peripheral drivers to each buffer circuit. This can reduce the differences in time when the transfer transistors 31 are turned on and off in the pixel array PA.

Figure 11:
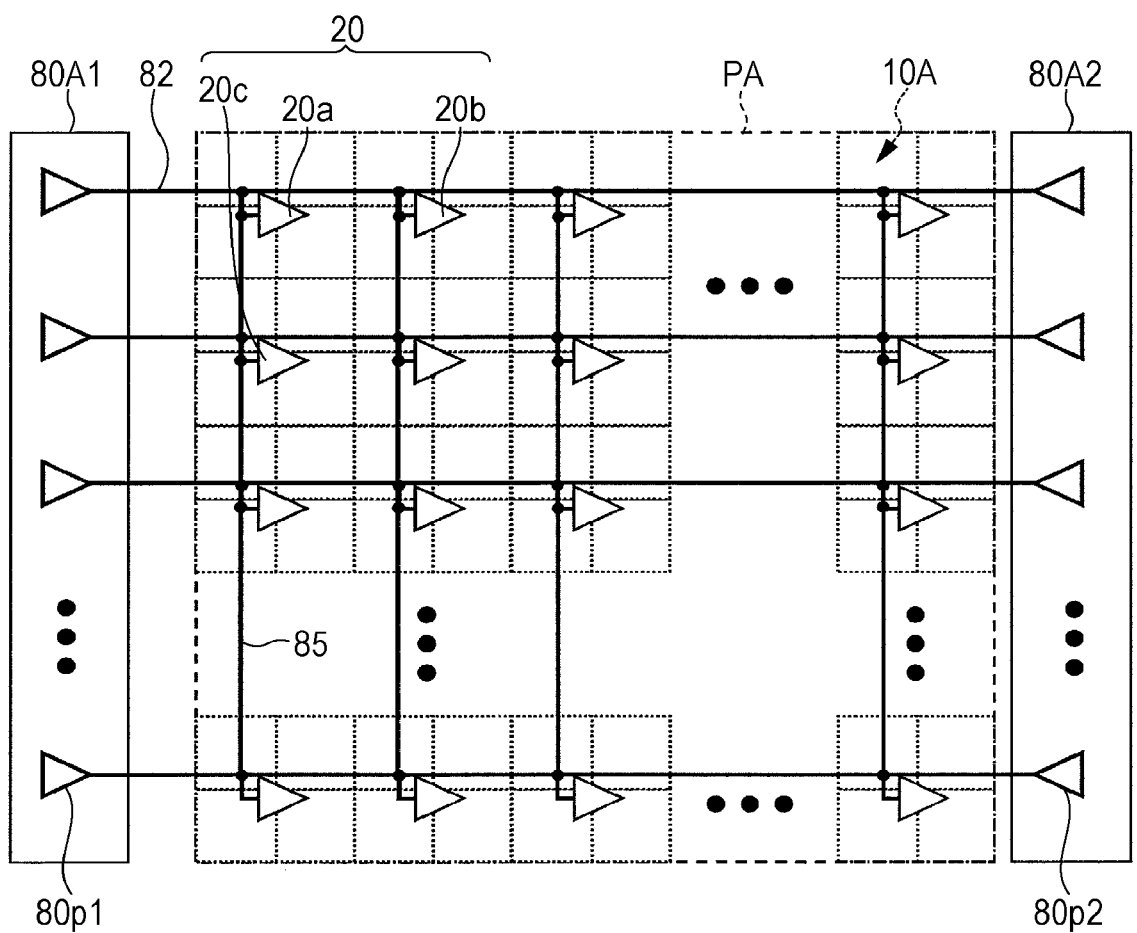
FIG. 11 is a diagram illustrating another example of arrangement of peripheral drivers.

FIG. 11 illustrates still another example of arrangement of peripheral drivers. In the configuration illustrated in FIG. 11, a plurality of input signal lines 82 are connected to each other through connection lines 85 extending in the column direction of a plurality of pixel cells 10A. For example, the input signal line 82 including connection with the input of a buffer circuit 20a and the input signal line 82 including connection with the input of a buffer circuit 20c are connected to each other through the connection lines 85. In this example, since the buffer circuits 20 are arranged in a matrix, the plurality of connection lines 85 are accordingly arranged for the respective columns of the plurality of buffer circuits 20. By connecting the plurality of input signal lines 82 to each other, it is possible to cancel the influences of the time difference between input signals from the peripheral drivers, the variations in transistor characteristics of the peripheral buffers in each peripheral driver, and the like.

Figure 12:
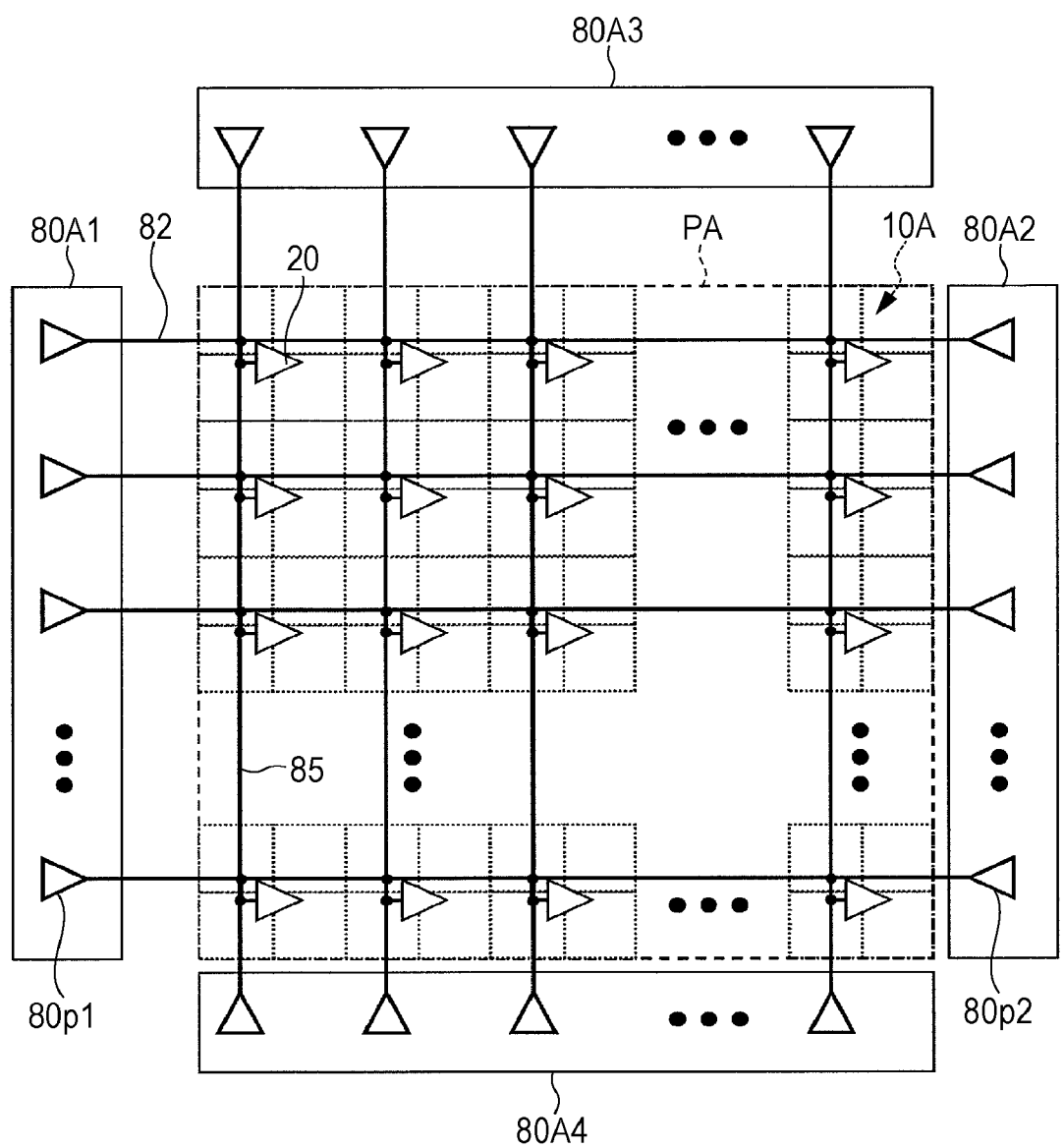
FIG. 12 is a diagram illustrating still another example of arrangement of peripheral drivers.

FIG. 12 illustrates still another example of arrangement of peripheral drivers. As illustrated in FIG. 12, peripheral drivers 80A3 and peripheral drivers 80A4 may be provided along the other two sides of the rectangular pixel array PA. The outputs of the peripheral drivers 80A3 and 80A4 are connected to each other. In this example, in other words, the input signal lines 82 and connection lines 85 constitute a grid-shaped output signal wiring as a whole. According to such a configuration, it is possible to more effectively reduce the difference between the respective peripheral drivers in delay of output signals from peripheral buffers.

Figure 13:
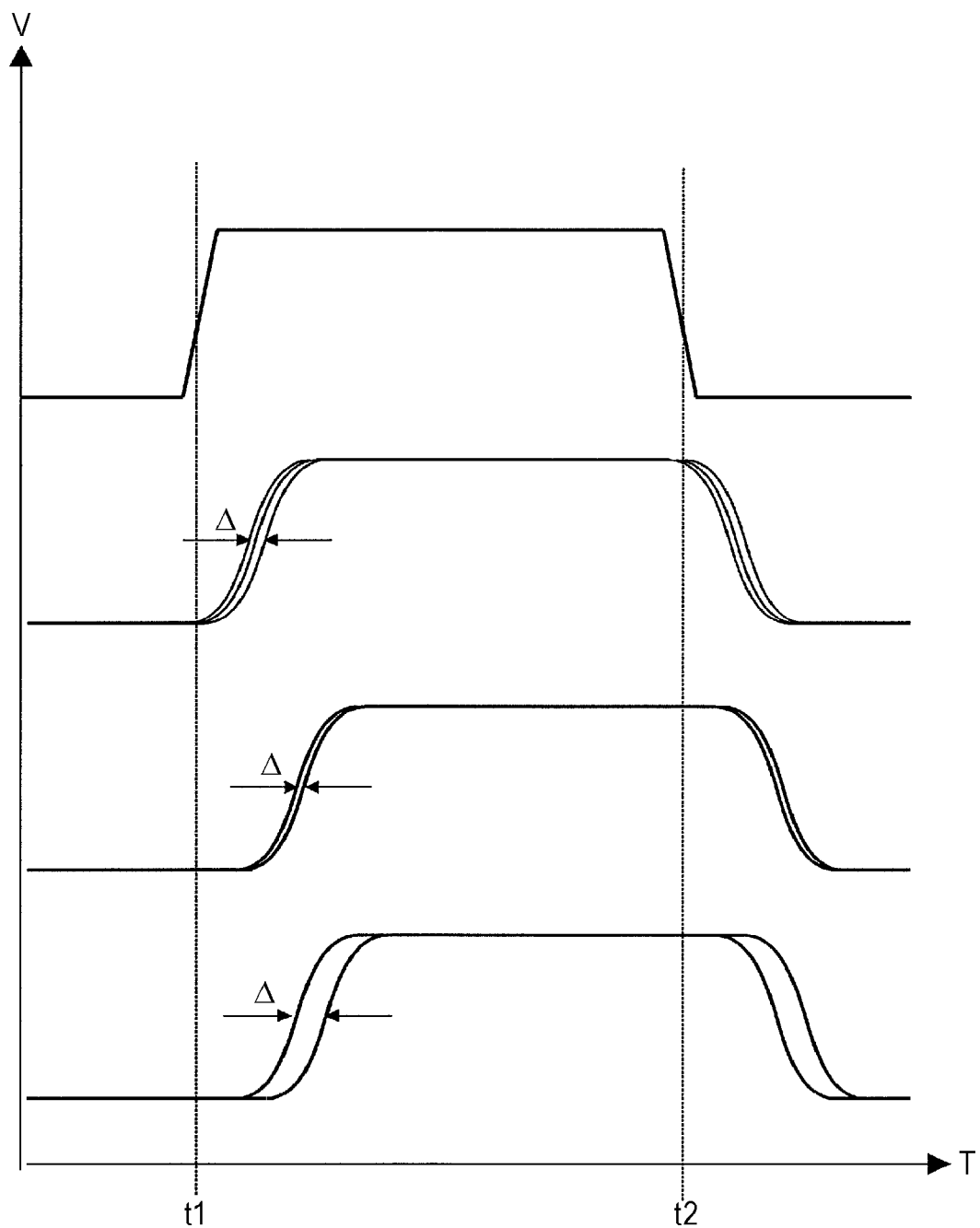
FIG. 13 is a diagram for explaining the effect of connecting control signal lines of a plurality of pixel blocks to each other, the control signal lines being connected to gates of transfer transistors.
Figure 14:
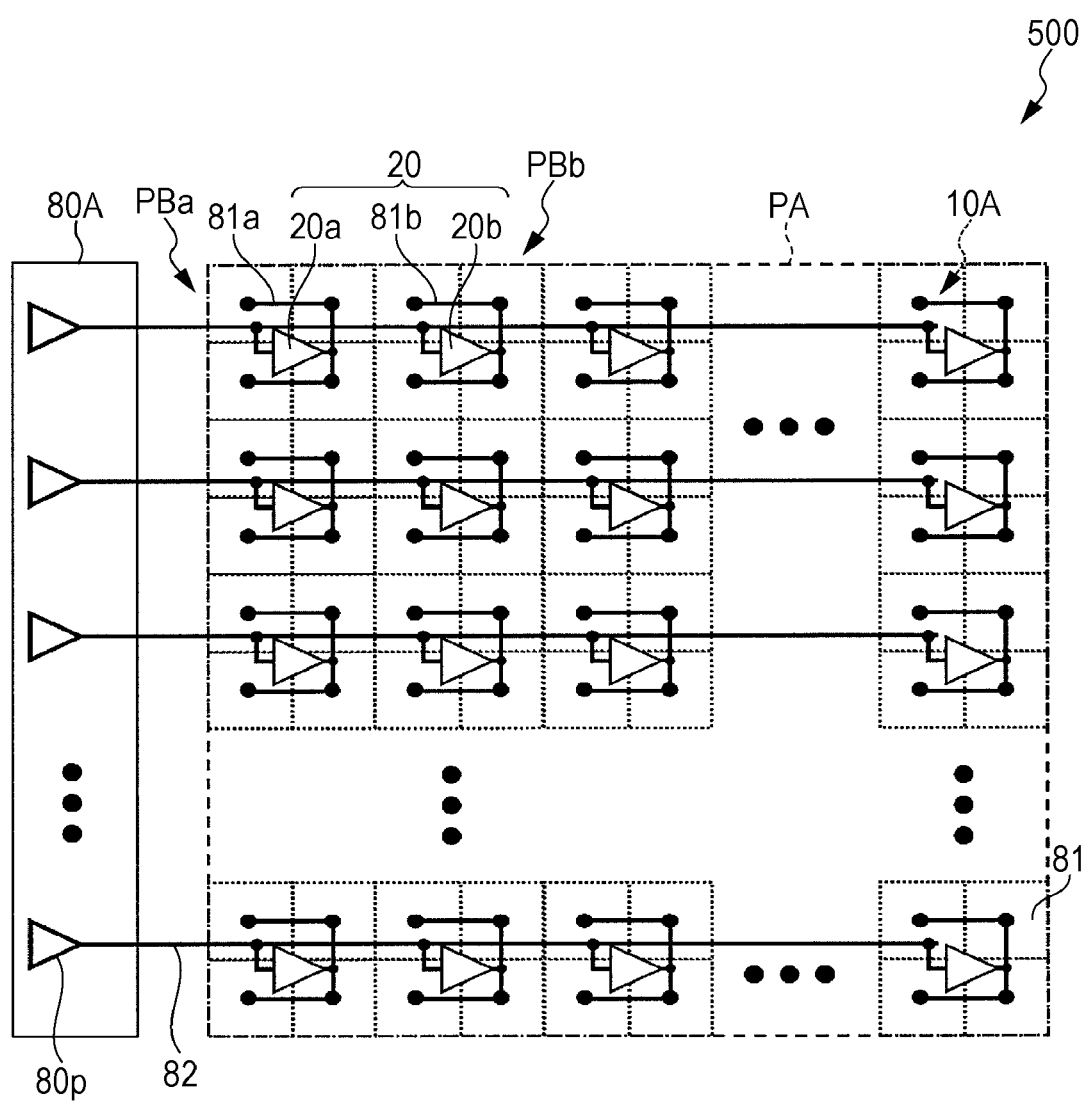
FIG. 14 is a diagram illustrating a circuit configuration of an imaging device as a comparative example.

FIG. 13 is a schematic diagram of signal waveforms for explaining the effect of connecting control signal lines in a plurality of pixel blocks to each other, the control signal lines being connected to gates of transfer transistors 31. FIG. 13 illustrates a signal waveform in the configuration explained with reference to FIG. 12 and a signal waveform in a comparative example illustrated in FIG. 14 together. FIG. 14 illustrates a circuit configuration of an imaging device 500 as a comparative example. As schematically illustrated in FIG. 14, in a pixel array PA of the imaging device 500, the control signal line of each pixel block does not connect to the control signal line of another pixel block. For example, a control signal line 81a in a pixel block PBa in FIG. 14 and a control signal line 81b in a pixel block PBb are not connected to each other.

In FIG. 13, the top of four waveforms shows a waveform of an ideal input signal to peripheral drivers (the peripheral drivers 80A1 to 80A4 or peripheral driver 80A). In this waveform, the signal level rises from the low level to the high level at time t1 and falls from the high level to the low level at the time t2.

The second waveform from the top in FIG. 13 shows signal waveforms at the inputs of buffer circuits 20 placed in the pixel array PA when the signal of the above-described waveform is inputted to the peripheral driver. As schematically illustrated, there is a delay difference A according to the distance from the peripheral driver to each buffer circuit 20. The delay difference A refers to a time difference at an intermediate level between the high and low levels. In the configuration illustrated in FIG. 12, for example, the delay of the rising edge of signal increases with distance from the outer edge of the pixel array PA (toward the center of the pixel array PA). In the configuration illustrated in FIG. 14, the delay of the rising edge of signal increases with distance from the peripheral driver 80A.

The third waveform from the top in FIG. 13 shows signal waveforms at outputs of buffer circuits 20 in the configuration illustrated in FIG. 12. The signal waveform at the output of each buffer circuit 20 corresponds to the waveform of a signal applied to the gate of the corresponding transfer transistor 31. When the control signal lines connected to the outputs of the buffer circuits 20 in the plurality of pixel blocks are connected to each other (see FIG. 3, for example), the delay difference A is reduced. According to the first embodiment of the disclosure, the delay difference A can be reduced to about 10% of that in the case where the control signal lines, which are connected to the outputs of the buffer circuits 20 in the plurality of pixel blocks, are not connected to each other.

The waveform at the bottom in FIG. 13 shows signal waveforms at the output of each buffer circuit 20 in the comparative example illustrated in FIG. 14. The delay difference A in the signal waveforms is larger than that of the waveform at the input of each buffer circuit 20 (the second waveform from the top). This is caused by further addition of the influences of the variations in transistor characteristics of the buffer circuits 20, the variations in parasitic capacitance of wirings, and the like. As apparent from the comparison between the third and fourth waveforms from the top in FIG. 13, the delay difference A in control signals for the transfer transistors 31 can be reduced by connecting the control signal lines, which are connected to the outputs of the buffer circuits 20 in the plurality of pixel blocks, to each other.

Third Embodiment

Figure 15:
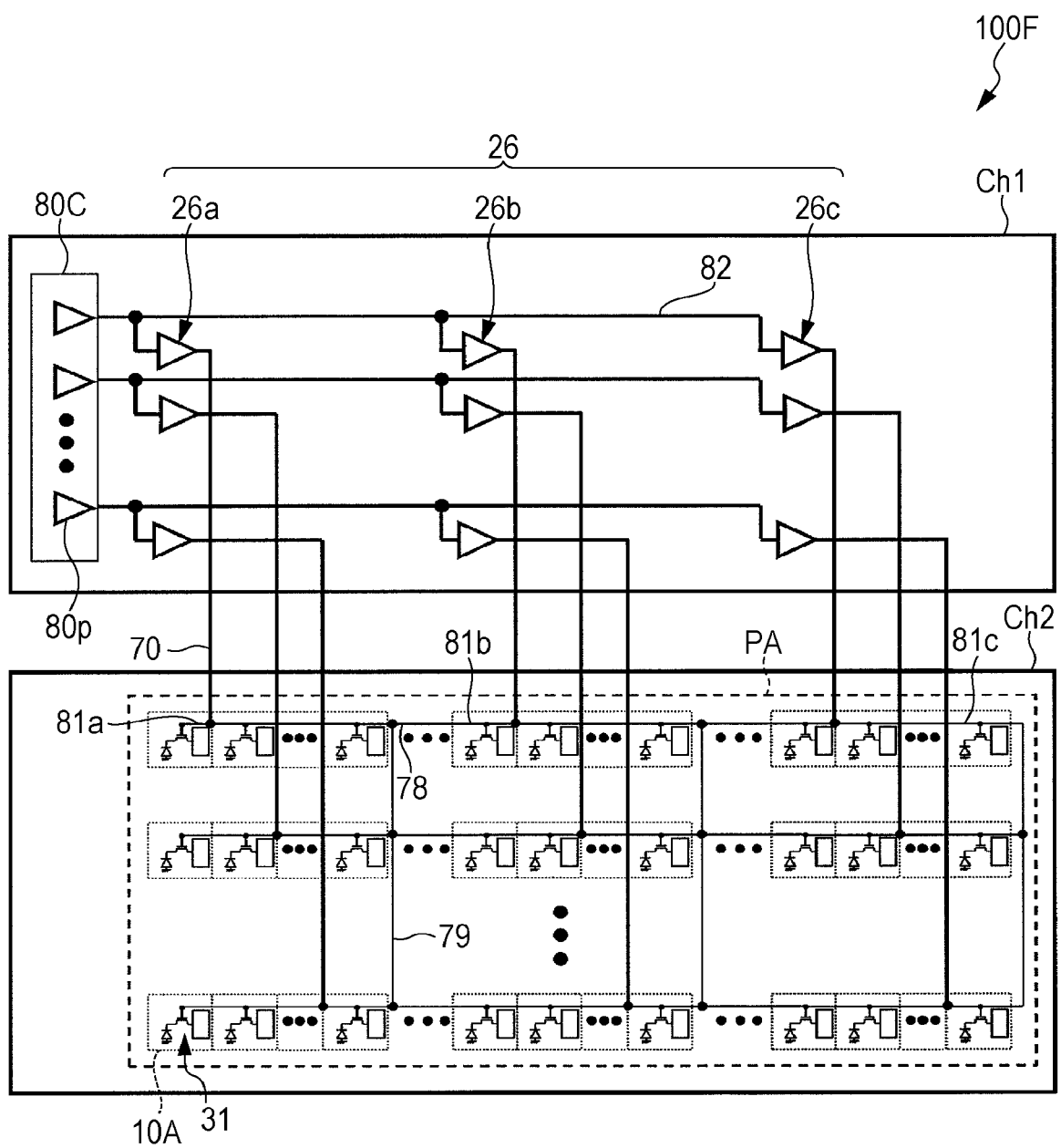
FIG. 15 is a diagram illustrating an exemplary configuration of an imaging device according to a third embodiment of the disclosure.

FIG. 15 illustrates an exemplary configuration of an imaging device according to a third embodiment of the disclosure. An imaging device 100F illustrated in FIG. 15 schematically includes a first chip Ch1 including a plurality of buffer circuits 26 and a second chip Ch2 including a pixel array PA.

The chip Ch1 further includes a peripheral driver 80C and a plurality of input signal lines 82. As illustrated in FIG. 15, inputs of the plurality of buffer circuits 26 on the chip Ch1 are connected to any one of the input signal lines 82 connected to the peripheral driver 80C. In this example, the plurality of buffer circuits 26 include buffer circuits 26a, 26b, and 26c with the inputs connected to the same input signal line 82.

In the exemplary configuration illustrated in FIG. 15, the pixel array PA including an array of a plurality of pixel cells 10A is formed in the chip Ch2. In this example, the pixel array PA formed in the chip Ch2 has the substantially same configuration as that of the pixel array PA described with reference to FIG. 9 except that the buffer circuits 22 are not arranged in the pixel array PA. For example, the pixel array PA illustrated in FIG. 15 includes: a pixel block including the plurality of pixel cells 10A in which gates of the transfer transistors 31 are connected to a control signal line 81a; a pixel block including the plurality of pixel cells 10A in which gates of the transfer transistors 31 are connected to a control signal line 81b; and a pixel block including the plurality of pixel cells 10A in which gates of the transfer transistors 31 are connected to a control signal line 81c. In a similar manner to the pixel array PA described with reference to FIG. 9, the control signal lines in the plurality of pixel blocks arranged in the row direction are connected to each other through connection lines 78. For example, the control signal lines 81a, 81b, and 81c are connected to each other through the connection lines 78. Moreover, in this example, the control signal lines in the plurality of pixel blocks arranged in the column direction are connected to each other through connection lines 79. In the embodiment described herein, it is unnecessary that the control signal lines in a plurality of pixel blocks are connected to each other.

As schematically illustrated in FIG. 15, outputs of the buffer circuits 26 on the chip Ch1 are connected to the control signal lines on the chip Ch2 through connection lines 70. The output of the buffer circuit 26a is connected to the control signal line 81a through the corresponding connection line 70. In a similar manner, the output of the buffer circuit 26b is connected to the control signal line 81b through the corresponding connection line 70, and the output of the buffer circuit 26c is connected to the control signal line 81c through the corresponding connection line 70. When the plurality of buffer circuits 26 receiving output voltage from the peripheral driver 80C are provided in a chip (the chip Ch1 herein) different from a chip (the chip Ch2 herein) where the pixel array PA is formed, the plurality of connection lines 70 connecting the buffer circuits 26 and the control signal lines can be configured to have a substantially same length. It is therefore possible to reduce the variations in parasitic capacitance of the plurality of connection lines connecting the buffer circuits 26 on the chip Ch1 to the control signal lines on the chip Ch2. This can reduce the difference in delay between signals at the transfer transistors 31 including connection with the control signal line connected to a certain one of the connection lines 70 and the transfer transistors 31 including connection with the control signal line connected to another connection line 70.

In this example, since the plurality of control signal lines formed on the chip Ch2 are connected to each other through the connection lines 78 and 79. It is possible to average the variations in transistor characteristics of the buffer circuits 26 on the chip Ch1, the variations in parasitic capacitance of the control signal lines on the chip Ch2, and the like. This can reduce the differences in time when the transfer transistors 31 are turned on or off between the plurality of pixel cells 10A included in the pixel array PA.

The chip Ch1 may be stacked on the chip Ch2. In other words, the imaging device 100F may include a stacked structure of the chips Ch1 and Ch2. By employing the stacked structure of the chips Ch1 and Ch2, the length of the plurality of connection lines 70 can be equalized easily. In this case, the buffer circuits 26 on the chip Ch1 and the control signal lines on the chip Ch2 can be electrically connected using solder balls (also called microbumps) or through-vias (typically, through silicon vias (TSV)), for example. In such a manner, the connection lines 70 are not limited to linear conductive members. The imaging device 500 may further include an interposer between the chips Ch1 and Ch2 in order to adjust the distance between terminals.

According to the configuration in which the peripheral driver 80C and buffer circuits 26 are arranged on the chip Ch1, which is different from the chip Ch2 where the pixel array PA is formed, the flexibility in wiring design is improved. Accordingly, the time constant of wirings between the peripheral driver 80C and buffer circuits 26 can be reduced by forming the wirings connecting the outputs of the peripheral drivers 80C to the inputs of the buffer circuits 26 on the same chip as the buffer circuits 26, for example. It is also possible to comparatively easily equalize the length of the wiring (that is, a part of the input signal lines 82) connecting a certain one of buffer circuits 26 (the buffer circuit 26a, for example) to the peripheral driver 80C and the length of the wiring connecting another buffer circuit 26 (the buffer circuit 26b, for example) to the peripheral driver 80C. This can reduce the differences in delay of input signals from the peripheral driver 80C for each buffer circuit 26. Reducing the differences in delay of input signals from the peripheral driver 80C for each buffer circuit 26 provides an effect on reducing the differences in delay of input signals in the transfer transistors 31 on the chip Ch2.

The buffer circuits 26 may be formed on one of the main surfaces of the chip Ch1 while the input signal lines 82 are arranged on the other main surface. In this case, the buffer circuits 26 and the input signal lines 82 are connected with through-vias, for example.

As described above, according to the embodiments of the disclosure, it is possible to reduce the differences in time when the transistors of the pixel cells are accessed across the entire imaging region with the simple configuration. The aforementioned embodiments may be combined properly.

In the examples described in the above embodiments, the differences in delay of control signals for the transfer transistors 31 is reduced. However, it is certain that applications of the embodiments are not limited to the transfer transistors 31. Each of the aforementioned embodiments can be suitably applied to the configuration in which a different type of transistors arranged in the respective a plurality of pixel cells are simultaneously turned on and off. For example, the configuration of FIG. 2 may be applied to the reset transistors 46. In the aforementioned embodiments, the transfer transistors 31, reset transistors 46, signal detection transistors 42, and address transistors 44 are N-channel MOSFETs by way of example. However, these transistors may be P-channel MOSFETs. However, it is unnecessary that all of the transistors are N-channel or P-channel MOSFETs. The transistors can be bipolar transistors as well as FETs.

The imaging device of the disclosure is applicable to various types of camera systems and sensor systems such as digital still cameras, medical cameras, monitoring cameras, in-vehicle cameras, robot cameras, digital single-lens reflex cameras, and digital mirrorless cameras. Moreover, the imaging device of the disclosure is applicable to input devices for gesture control, for example.

What is claimed is:

1. An imaging device, comprising:
    pixels arranged in rows and columns, the pixels including:
        a first pixel located in a row, the first pixel including a first photoelectric converter and a first transistor coupled to the first photoelectric converter, the first transistor having a first control terminal;
        a second pixel located in the row, the second pixel including a second photoelectric converter and a second transistor coupled to the second photoelectric converter, the second transistor having a second control terminal;
        a third pixel located in the row, the third pixel including a third photoelectric converter and a third transistor coupled to the third photoelectric converter, the third transistor having a third control terminal; and
        a fourth pixel located in the row, the fourth pixel including a fourth photoelectric converter and a fourth transistor coupled to the fourth photoelectric converter, the fourth transistor having a fourth control terminal;
    an input signal line extending along the row, a signal for controlling the first to fourth transistors being input to the input signal line;
    a first buffer circuit having a first input terminal and a first output terminal, the first input terminal being coupled to the input signal line, the first output terminal being coupled to the first control terminal and the third control terminal; and
    a second buffer circuit having a second input terminal and a second output terminal, the second input terminal being coupled to the input signal line, the second output terminal being coupled to the second control terminal and the fourth control terminal.

2. The imaging device according to claim 1, comprising a first chip and a second chip different from the first chip, wherein
    the input signal line, the first buffer circuit and the second buffer circuit are included in the first chip, and
    the first to fourth pixels are included in the second chip.

3. The imaging device according to claim 2, wherein the first chip is stacked on the second chip.

4. The imaging device according to claim 1, comprising a first chip having a first surface and a second surface opposite to the first surface, wherein
    the input signal line, the first buffer circuit and the second buffer circuit are located on the first surface, and
    the first to fourth pixels are located on the second surface.

5. The imaging device according to claim 1, further comprising a first peripheral driver, wherein one end of the input signal line is coupled to the first peripheral driver.

6. The imaging device according to claim 5, further comprising a second peripheral driver, wherein the other end of the input signal line is coupled to the second peripheral driver.

7. The imaging device according to claim 1, wherein
    one of a source and a drain of the first transistor is coupled to the first photoelectric converter,
    one of a source and a drain of the second transistor is coupled to the second photoelectric converter,
    one of a source and a drain of the third transistor is coupled to the third photoelectric converter, and
    one of a source and a drain of the fourth transistor is coupled to the fourth photoelectric converter.

8. The imaging device according to claim 1, wherein
    the first pixel includes a first transfer transistor, one of a source and a drain of the first transfer transistor being coupled to the first photoelectric converter,
    one of a source and a drain of the first transistor is coupled to the other of the source and the drain of the first transfer transistor,
    the second pixel includes a second transfer transistor, one of a source and a drain of the second transfer transistor being coupled to the second photoelectric converter,
    one of a source and a drain of the second transistor is coupled to the other of the source and the drain of the second transfer transistor,
    the third pixel includes a third transfer transistor, one of a source and a drain of the third transfer transistor being coupled to the third photoelectric converter,
    one of a source and a drain of the third transistor is coupled to the other of the source and the drain of the third transfer transistor,
    the fourth pixel includes a fourth transfer transistor, one of a source and a drain of the fourth transfer transistor being coupled to the fourth photoelectric converter, and
    one of a source and a drain of the fourth transistor is coupled to the other of the source and the drain of the fourth transfer transistor.

9. The imaging device according to claim 1, wherein
    the first buffer circuit and the second buffer circuit each include one or more stages, and
    a number of the one or more stages of the first buffer circuit is different from a number of the one or more stages of the second buffer circuit.

10. The imaging device according to claim 9, further comprising a first peripheral driver coupled to one end of the input signal line, wherein a distance from the one end of the input signal line to the first input terminal is less than a distance from the one end of the input signal line to the second input terminal, and the number of the one or more stages of the first buffer circuit is greater than the number of the one or more stages of the second buffer circuit.

* * * * *